US011659725B2

(12) United States Patent
Lee et al.

(10) Patent No.: US 11,659,725 B2
(45) Date of Patent: May 23, 2023

(54) QUANTUM DOT LIGHT EMITTING DEVICE WITH ELECTRON AUXILIARY LAYER AND DISPLAY DEVICE INCLUDING THE SAME

(71) Applicant: SAMSUNG ELECTRONICS CO., LTD., Suwon-si (KR)

(72) Inventors: Heejae Lee, Seongnam-si (KR); Sung Woo Kim, Hwaseong-si (KR); Eun Joo Jang, Suwon-si (KR); Dae Young Chung, Suwon-si (KR); Moon Gyu Han, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 211 days.

(21) Appl. No.: 16/921,188

(22) Filed: Jul. 6, 2020

(65) Prior Publication Data
US 2021/0005834 A1    Jan. 7, 2021

(30) Foreign Application Priority Data
Jul. 5, 2019    (KR) .................. 10-2019-0081628

(51) Int. Cl.
*H01L 51/50*    (2006.01)
(52) U.S. Cl.
CPC ........ *H01L 51/502* (2013.01); *H01L 51/5056* (2013.01); *H01L 51/5092* (2013.01)
(58) Field of Classification Search
CPC combination set(s) only.
See application file for complete search history.

(56) References Cited

U.S. PATENT DOCUMENTS 8,216,697 B2    7/2012  Begley et al.
9,054,330 B2    6/2015  Qian et al.
(Continued)

FOREIGN PATENT DOCUMENTS

JP    2007200662 A    8/2007
KR    101658691 A1    9/2016
(Continued)

OTHER PUBLICATIONS

Duo Wang et al., "ZnO/SnO2 Double Electron Transport Layer Guides Improved Open Circuit Voltage for Highly Efficient CH3NH3PbI3-Based Planar Perovskite Solar Cells," ACS Applied Energy Materials, Apr. 23, 2018, pp. 2215-2221, vol. 1.
(Continued)

*Primary Examiner* — Daniel Whalen
(74) *Attorney, Agent, or Firm* — Cantor Colburn LLP

(57)    ABSTRACT

A light emitting device includes: a first electrode and a second electrode with a surface facing the first electrode; an emission layer disposed between the first electrode and the second electrode and including a quantum dot (e.g., a plurality of quantum dots); and an electron auxiliary layer disposed between the emission layer and the second electrode. The electron auxiliary layer includes a first layer including a first metal oxide, and a second layer disposed on the first layer and including a second metal oxide. A roughness of an interface between the second layer and the second electrode is less than about 10 nm as determined by an electron microscopy analysis. An absolute value of a difference between a conduction band edge energy level of the second layer and a work function of the second electrode may be less than or equal to about 0.5 eV, and a conduction band edge energy level of the first layer may be less than the conduction band edge energy level of the second layer.

21 Claims, 12 Drawing Sheets
(3 of 12 Drawing Sheet(s) Filed in Color)

(56) References Cited

U.S. PATENT DOCUMENTS

| | | | |
|---|---|---|---|
| 9,419,248 B2 | 8/2016 | Nakamura | |
| 2009/0053559 A1 | 2/2009 | Spindler et al. | |
| 2019/0081262 A1 | 3/2019 | Kim et al. | |
| 2019/0097151 A1* | 3/2019 | Lee | H01L 51/5206 |
| 2019/0131557 A1* | 5/2019 | Lee | H01L 51/508 |
| 2019/0198796 A1* | 6/2019 | Kim | G09G 3/3208 |
| 2021/0193876 A1* | 6/2021 | Chen | H01L 51/5056 |

FOREIGN PATENT DOCUMENTS

| | | |
|---|---|---|
| KR | 20160134524 A | 11/2016 |
| KR | 101725486 B1 | 4/2017 |
| KR | 101881165 B1 | 8/2018 |
| KR | 20190029470 A | 3/2019 |

OTHER PUBLICATIONS

Elham Halvani Anaraki et al., "Low-Temperature Nb-Doped SnO2 Electron-Selective Contact Yields over 20% Efficiency in Planar Perovskite Solar Cells," ACS Energy Letters, Mar. 1, 2018, Pages 773-778, vol. 3.

Janardan Dagara et al., "ighly efficient perovskite solar cells for light harvesting under indoor illumination via solution processed SnO2/MgO composite electron transport layers," Nano Energy, Apr. 12, 2018, pp. 290-299, vol. 49.

Mohammad Mahdi Tavakoli et al., "Mesoscopic Oxide Double Layer as Electron Specific Contact for Highly Efficient and UV Stable Perovskite Photovoltaics," Nano Letters, Mar. 12, 2018, pp. 2428-2434, vol. 18.

Ping Shen et al., "High-efficiency polymer solar cells with low temperature solution-processed SnO2/PFN as a dual-function electron transporting layer," Journal of Materials Chemistry A, Aug. 14, 2018, pp. 17401-17408, vol. 6.

Sawanta S. Mali et al., "Highly porous Zinc Stannate (Zn2SnO4) nanofibers scaffold photoelectrodes for efficient methyl ammonium halide perovskite solar cells," Scientific Reports, Jun. 22, 2015, pp. 1-14, vol. 5:11424 | DOI: 10.1038/srep11424.

Shuai Huang et al., "Solution-processed SnO2 nanoparticle interfacial layers for efficient electron transport in ZnO-based polymer solar cells," Organic Electronics, Aug. 22, 2018, pp. 373-381, vol. 62.

Xiu Gong et al., "Highly Efficient Perovskite Solar Cells with Gradient Bilayer Electron Transport Materials," Nano Letters, May 21, 2018, pp. 3969-3977, vol. 18.

Yizhe Sun et al., "High-Performance Quantum Dot Light-Emitting Diodes Based on Al-Doped ZnO Nanoparticles Electron Transport Layer," ACS Applied Materials & Interfaces, May 10, 2018, pp. 18902-18909, vol. 10.

\* cited by examiner

QUANTUM DOT LIGHT EMITTING DEVICE WITH ELECTRON AUXILIARY LAYER AND DISPLAY DEVICE INCLUDING THE SAME

CROSS-REFERENCE TO RELATED APPLICATION

This application claims priority to Korean Patent Application No. 10-2019-0081628 filed in the Korean Intellectual Property Office on Jul. 5, 2019, and all the benefits accruing therefrom under 35 U.S.C. § 119, the entire content of which is incorporated herein by reference.

BACKGROUND

1. Field

A light emitting device and a display device are disclosed.

2. Description of the Related Art

Unlike bulk materials, intrinsic physical characteristics (e.g., bandgap energy or melting point.) of nanoparticles may be varied by changing the size of the nanoparticle. A quantum dot may exhibit electroluminescent and photoluminescent properties. For example, a semiconductor nanocrystal particle, also known as a quantum dot, if placed in an excited energy state, e.g., with irradiation from a light source or with electrical energy, e.g., an applied electric current, may emit light in a wavelength corresponding to the size of the quantum dot.

Accordingly, the quantum dot may be used as a light emitting element that can emit light of a particular wavelength, and is of present interest.

SUMMARY

Research on using a quantum dot as a light emitting element in a light emitting device is ongoing and of great interest. Described herein is developing a quantum dot and design improvements to a light emitting device that use quantum dots having improved performance.

An embodiment provides a light emitting device having improved performance.

An embodiment provides an electronic device including the light emitting device.

According to an embodiment, a light emitting device includes a first electrode and a second electrode with a surface facing the first electrode;

an emission layer disposed between the first electrode and the second electrode and including a quantum dot (e.g., a plurality of quantum dots); and and an electron auxiliary layer disposed between the emission layer and the second electrode, wherein the electron auxiliary layer includes a first layer proximate to the emission layer and including a first metal oxide, and a second layer disposed on the first layer and proximate to the second electrode, the second layer including a second metal oxide, wherein a roughness of an interface between the second layer (e.g., an opposite surface of the second layer that is disposed directly on the surface of the second electrode) and the surface of the second electrode is less than about 10 nanometers (nm) as determined by an electron microscopy analysis.

In an embodiment, an absolute value of a difference between a conduction band edge energy level of the second layer and a work function of the second electrode may be less than or equal to about 0.5 electron volts (eV).

In an embodiment, a conduction band edge energy level of the first layer may be less than the conduction band edge energy level of the second layer.

In an embodiment, the conduction band edge energy level of the second layer may greater than the work function of the second electrode.

In an embodiment, an energy bandgap of the second metal oxide or the second layer may be less than or equal to about 3.5 eV, less than or equal to about 3.4 eV, less than or equal to about 3.35 eV, or less than or equal to about 3.3 eV.

In an embodiment, an energy bandgap of the second metal oxide or the second layer may be greater than or equal to about 3.0 eV, greater than or equal to about 3.1 eV, or greater than or equal to about 3.2 eV.

An absolute value of a difference between the conduction band edge energy level of the second layer and the work function of the second electrode is less than or equal to about 0.3 eV.

An absolute value of a difference between the conduction band edge energy level of the second layer and the work function of the second electrode is less than or equal to about 0.1 eV.

The emission layer may not include cadmium, lead, mercury, or a combination thereof. The emission layer may not include cadmium.

An amount of carbon in the first layer may be greater than an amount of carbon in the second layer, for example, as determined by X-ray photoelectron spectroscopy.

An amount of carbon in the first layer may be greater than about 6 mole percent (mol %) based on a total mole amount of elements included in the first layer.

An amount of carbon in the first layer may be greater than or equal to about 10 mol % based on a total mole amount of elements included in the first layer.

An amount of carbon in the first layer may be less than or equal to about 60 mol % based on a total mole amount of elements included in the first layer.

The first metal oxide may have a composition different from that of the second metal oxide.

The first metal oxide may include zinc, magnesium, calcium, zirconium, yttrium, titanium, tin, tungsten, niobium, cerium, strontium, barium, indium, silicon, nickel, copper, cobalt, molybdenum, vanadium, gallium, manganese, iron, aluminum, or a combination thereof.

The first metal oxide may include a zinc oxide, a zinc magnesium oxide, a tin oxide, a titanium oxide, or a combination thereof.

The first metal oxide may include $TiO_2$, $ZnO$, $SnO_2$, $WO_3$, $In_2O_3$, $Nb_2O_5$, $Fe_2O_3$, $CeO_2$, $SrTiO_3$, $Zn_2SnO_4$, $BaSnO_3$, $Al_2O_3$, $ZrO_2$, $SiO_2$, or a combination thereof.

The first metal oxide may be represented by Chemical Formula 1:

$$Zn_{1-x}M_xO \qquad \text{Chemical Formula 1}$$

In Chemical Formula 1, M is Mg, Ca, Zr, W, Li, Ti, Y, Al, or a combination thereof, and $0 \leq x < 0.5$.

The first layer may include a nanoparticle (or a plurality of nanoparticles) of the first metal oxide.

An average particle size of the plurality of nanoparticles (of the first metal oxide) may be greater than or equal to about 1 nanometer (nm).

An average particle size of the plurality of nanoparticles may be less than or equal to about 10 nanometers.

In one embodiment, a surface of the second layer may be disposed directly on a surface of the first layer.

An amount of carbon in the second layer may be less than or equal to about 12 mol % based on a total mole amount of elements included in the second layer. An amount of carbon in the second layer may be less than or equal to about 10 mol % based on a total mole amount of elements included in the second layer. An amount of carbon in the second layer may be less than or equal to about 8 mol % based on a total mole amount of elements included in the second layer. An amount of carbon in the second layer may be less than or equal to about 6 mol % based on a total mole amount of elements included in the second layer.

An amount of carbon in the second layer may be greater than or equal to 0 mol % based on a total mole amount of elements included in the second layer.

An amount of carbon in the second layer may be greater than or equal to 0.1 mol % based on a total mole amount of elements included in the second layer.

A surface roughness of an interface between a surface of the second layer and a surface of the first layer may be less than or equal to about 12 nm as determined by an electron microscopy analysis.

A surface roughness of an interface between a surface of the second layer and a surface of the first layer may be less than or equal to about 10 nm as determined by an electron microscopy analysis.

A surface roughness of an interface between a surface of the second layer and a surface of the first layer may be less than or equal to about 9 nm as determined by an electron microscopy analysis.

A surface roughness of an interface between a surface of the second layer and a surface of the first layer may be less than or equal to about 8 nm as determined by an electron microscopy analysis.

The second metal oxide may include zinc, magnesium, calcium, zirconium, yttrium, titanium, tin, tungsten, niobium, cerium, strontium, barium, indium, silicon, nickel, copper, cobalt, molybdenum, vanadium, gallium, manganese, iron, aluminum, or a combination thereof.

The second metal oxide may include $TiO_2$, ZnO, $SnO_2$, $WO_3$, $In_2O_3$, $Nb_2O_5$, $Fe_2O_3$, $CeO_2$, $SrTiO_3$, $Zn_2SnO_4$, $BaSnO_3$, $Al_2O_3$, $ZrO_2$, $SiO_2$, or a combination thereof.

The second metal oxide may include a zinc oxide, a zinc magnesium oxide, a tin oxide, a titanium oxide, or a combination thereof.

The second metal oxide may be represented by Chemical Formula 2:

$$Zn_{1-x}M_xO \quad \text{Chemical Formula 2}$$

In Chemical Formula 2, M is Mg, Ca, Zr, W, Li, Ti, Y, Al, or a combination thereof, and 0≤x<0.5.

A roughness of an interface between an opposite surface of the second layer and the surface of the second electrode is less than about 5 nm as determined by an electron microscopy analysis.

A roughness of an interface between an opposite surface of the second layer and the surface of the second electrode is less than about 3 nm as determined by an electron microscopy analysis.

A thickness of the second layer may be greater than or equal to about 1 nm. A thickness of the second layer may be less than or equal to about 30 nm.

A difference between a conduction band edge energy level of the first layer and a conduction band edge energy level of the second layer may be greater than or equal to about 0.05 eV.

A difference between a conduction band edge energy level of the first layer and a conduction band edge energy level of the second layer may be greater than or equal to about 0.1 eV.

A difference between a conduction band edge energy level of the first layer and a conduction band edge energy level of the second layer may be less than or equal to about 1 eV.

In one embodiment, the light emitting device may further include a buffer layer disposed on an opposite surface of the second electrode, and optionally on an opposite surface of the second layer, the buffer layer including an organic metal compound, a metal fluoride (e.g., lithium fluoride), or a combination thereof.

The metal of the organic metal compound or the metal fluoride may include lithium, aluminum, or a combination thereof.

The metal fluoride may include lithium fluoride.

The organic moiety of the organic metal compound may include an aromatic cyclic moiety, a heteroaromatic cyclic moiety, each of which optionally may include fluorine, or a combination thereof.

The organic metal compound may include 8-hydroxyquinolatolithium (Liq), tris(8-hydroxyquinolinato)aluminium (Alq3), or a combination thereof.

The buffer layer may have an electrical conductivity of less than or equal to about $3 \times 10^{-4}$ Siemens per centimeter (S/cm).

A thickness of the buffer layer may be greater than or equal to about 3 nm, greater than or equal to about 5 nm, greater than or equal to about 7 nm.

The light emitting device may further include an organic polymer layer disposed on (e.g., an opposite surface of) the second electrode.

The organic polymer layer may not contact with a major surface of the second layer.

The organic polymer layer may include a polymerization product of a monomer combination (e.g., a monomer composition) including a compound having at least one carbon-carbon double bond.

The monomer combination may further include a thiol compound.

The organic polymer layer may not include (meth)acrylic acid, benzoic acid, 3-butenoic acid, crotonic acid, butyric acid, isobutyric acid, acetic acid, propionic acid, a polymer thereof, or a combination thereof The organic polymer layer may cover (e.g., encapsulate) the first electrode, the second electrode, the emission layer, and the electron auxiliary layer.

The light emitting device may emit blue light, and a T50 of the light emitting device may be greater than or equal to about 10 hours.

According to an embodiment, a display device includes the aforementioned light emitting device.

In the device (e.g., electroluminescent device), an electron injection from a cathode may be efficiently carried out and a movement (extraction) of holes toward the anode may be effectively prohibited, and an electron transport rate may be controlled appropriately, whereby a carrier recombination at an interface and a bulk type non-emissive recombination may be reduced. Accordingly, the device of the embodiments may exhibit increased luminous efficiency and improved lifetime.

The layered structure included in the device of the embodiments may be used in various semiconductor devices such as a light emitting diode device, a sensor, a laser device, a solar cell device, and the like.

BRIEF DESCRIPTION OF THE DRAWINGS

The patent or application file contains at least one drawing executed in color. Copies of this patent or patent application publication with color drawinq(s) will be provided by the Office upon request and payment of the necessary fee.

The above and other advantages and features of this disclosure will become more apparent by describing in further detail exemplary embodiments thereof with reference to the accompanying drawings, in which.

DETAILED DESCRIPTION

Figure 1:
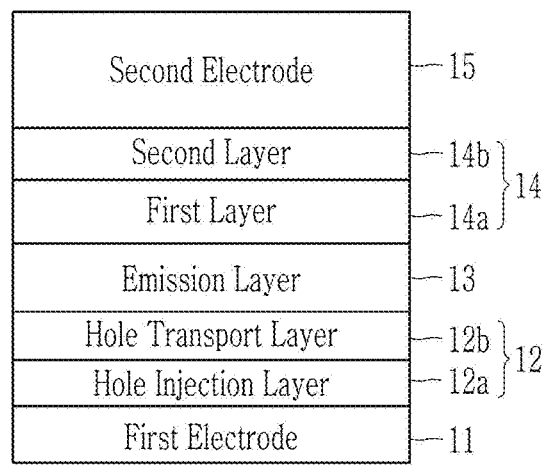
FIG. 1 is a schematic cross-sectional view of a non-limiting embodiment of a light emitting device.

Advantages and characteristics of this disclosure, and a method for achieving the same, will become evident referring to the following example embodiments together with the accompanying drawings so that a person skilled in the art would understand the same. This disclosure may, however, be embodied in many different forms and is not construed as limited to the example embodiments set forth herein. Rather, these embodiments are provided so that this disclosure will be thorough and complete, and will fully convey the scope of the invention to those skilled in the art. In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the expression that "not including cadmium (or other heavy metal)" or "substantially free of cadmium (or other heavy metal)" include the case where a concentration of the cadmium (or other heavy metal) may be less than or equal to about 100 ppm, less than or equal to about 50 ppm, less than or equal to about 10 ppm, or almost zero. In an embodiment, substantially no amount of the cadmium (or other heavy metal) is present or, if present, an amount of the cadmium (or other heavy metal) is less than or equal to a detection limit or as an impurity level of a given analysis tool (e.g., an inductively coupled plasma atomic emission spectroscopy).

As used herein, the term a work function, a conduction band (edge) energy level, or a highest occupied molecular orbital ("HOMO") or a lowest unoccupied molecular orbital (LUMO) energy level is expressed as an absolute value from a vacuum.

In addition, if a work function, a conduction band energy level, a HOMO energy level or a LUMO energy level is said to be 'deep,' 'high' or 'large,' the work function, the conduction band energy level, the HOMO energy level, or the LUMO energy level has a large absolute value relative to '0 eV,' i.e., the energy level of a vacuum. In contrast, if the work function, the conduction band energy level, the HOMO energy level, or the LUMO energy level is said to be 'shallow,' 'low,' or 'small,' the work function, the conduction band energy level, the HOMO energy level, or the LUMO energy level has a small absolute value from '0 eV,' i.e., the energy level of a vacuum.

As used herein, the word "Group" refers to a group in the periodic table of the elements.

As used herein, the term "Group II" refers to Group IIA and Group IIB of the Periodic Table of the elements, and examples of Group II metals may include Cd, Zn, Hg, and Mg, but are not limited thereto.

As used herein, the term "Group III" refers to Group IIIA and Group IIIB of the Periodic Table of the elements, and examples of Group III metals may include Al, In, Ga, and Tl, but are not limited thereto.

As used herein, the term "Group IV" may refer to Group IVA and Group IVB of the Periodic Table of the elements, and examples of a Group IV metal may include Si, Ge, and Sn, but are not limited thereto.

As used herein, the term "metal" refers to metallic or metalloid elements as defined in the Periodic Table of Elements selected from Groups 1 to 17 of the Periodic Table of the elements, including the lanthanide elements and the actinide elements, and includes a semi-metal such as Si.

As used herein, the term "Group I" may refer to Group IA and Group IB of the Periodic Table of the elements, and examples may include Li, Na, K, Rb, and Cs, but are not limited thereto.

As used herein, the term "Group V" may refer to Group VA of the Periodic Table of the elements, and examples may include nitrogen, phosphorus, arsenic, antimony, and bismuth, but are not limited thereto.

As used herein, the term "Group VI" may refer to Group VIA of the Periodic Table of the elements, and examples may include sulfur, selenium, and tellurium, but are not limited thereto.

As used herein, unless a definition is otherwise provided, "substituted" refers to the replacement of hydrogen of a compound, a group, or a moiety by at least one (e.g., 1, 2, 3, or 4) substituent independently selected from a C1 to C30 alkyl group, a C2 to C30 alkenyl group, a C2 to C30 alkynyl group, a C2 to C30 epoxy group, a C2 to C30 alkyl ester group, a C3 to C30 alkenyl ester group (e.g., acrylate group, methacrylate group), a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR or RC(=O)O—, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

Hereinafter, a light emitting device according to an embodiment is further described with reference to the drawings.

FIG. 1 is a schematic cross-sectional view of an embodiment of a light emitting device.

Referring to FIG. 1, a light emitting device according to an embodiment includes a first electrode 11 and a second electrode 15 having a surface facing the first electrode 11, an emission layer 13 disposed between the first electrode 11 and the second electrode 15, and including a quantum dot (e.g. a plurality of quantum dots), and an electron auxiliary layer 14 disposed between the second electrode 15 and the emission layer 13 wherein the electron auxiliary layer may include a first layer 14a disposed proximate (e.g., directly adjacent) to the emission layer and including a first metal oxide; and a second layer 14b disposed on the first layer 14a and proximate (e.g., directly adjacent) to the second electrode, and including a second metal oxide. The device may include a hole auxiliary layer 12 disposed between the first electrode 11 and the emission layer 13. The hole auxiliary later 12 may include a hole transport layer 12b proximate to the emission layer, and a hole injection layer 12a proximate to the first electrode 11.

A substrate (not shown) may be disposed on a surface of the first electrode 11 or an opposite surface of the second electrode 15, i.e. the surface not facing the first electrode 11. In an embodiment, the substrate may be disposed on a surface of the first electrode (e.g., under or below the first electrode of FIG. 1). The substrate may include an insulating material (e.g., insulating transparent substrate). The substrate may include glass; a polymer such as a polyester (e.g., polyethylene terephthalate (PET), polyethylene naphthalate (PEN)), a polycarbonate, a polyacrylate, a polyimide, a poly(amide-imide), a polysiloxane (e.g. PDMS), or a combination thereof; an inorganic material such as Al$_2$O$_3$, ZnO, or a combination thereof; or a combination comprising a least two of the foregoing, but is not limited thereto. The substrate may be made of a silicon wafer. As used herein, the term "transparent" refers to having a transmittance of greater than or equal to about 85% transmittance of light having a predetermined wavelength (e.g., light emitted from a quantum dot), or for example, transmittance of greater than or equal to about 88%, greater than or equal to about 90%, greater than or equal to about 95%, greater than or equal to about 97%, or greater than or equal to about 99%, e.g., about 85% to about 99.99%, or about 90% to about 99.9%. A thickness of the substrate may be appropriately selected considering a substrate material but is not particularly limited. The transparent substrate may be flexible. The substrate may be omitted.

One of the first electrode 11 or the second electrode may be an anode and the other may be a cathode. In an embodiment, the first electrode 11 may be an anode and the second electrode 15 may be a cathode.

The first electrode 11 may be made of an electrically conductive material, for example a metal, a conductive metal oxide, or a combination thereof, e.g., an electrically conductive material known in the art. The first electrode 11 may include, for example, a metal or an alloy thereof, the metal including nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of metal and a metal oxide such as ZnO and Al or $SnO_2$ and Sb, but is not limited thereto. A combination comprising at least two of the foregoing may also be used. In an embodiment, the first electrode may include a transparent conductive metal oxide, for example, indium tin oxide. A work function of the first electrode may be greater than a work function of the second electrode. Alternatively, a work function of the first electrode may be less than a work function of the second electrode.

The second electrode 15 may include a conductive material, for example a metal, a conductive metal oxide, a conductive polymer, or a combination thereof, e.g., an electrically conductive material known in the art. The second electrode 15 may include, for example, a metal or an alloy thereof, such as aluminum, magnesium, calcium, sodium, potassium, titanium, indium, yttrium, lithium, gadolinium, silver, gold, platinum, tin, lead, cesium, or barium; a multi-layer structured material such as LiF/Al, $Li_2O$/Al, 8-hydroxyquinolinolato-lithium/aluminum (Liq/Al), LiF/Ca, or $BaF_2$/Ca, but is not limited thereto. A combination comprising at least two of the foregoing may also be used. Details for the conductive metal oxide are the same as described above.

In an embodiment, a work function of the first electrode (e.g., an anode) may be greater than or equal to about 4.0 electron volts (eV), greater than or equal to about 4.1 eV, greater than or equal to about 4.2 eV, greater than or equal to about 4.3 eV, greater than or equal to about 4.4 eV, greater than or equal to about 4.5 eV, greater than or equal to about 4.6 eV, greater than or equal to about 4.7 eV, or greater than or equal to about 4.8 eV. A work function of the first electrode (e.g., an anode) may be less than or equal to about 5.5 eV, less than or equal to about 5.4 eV, less than or equal to about 5.3 eV, less than or equal to about 5.2 eV, less than or equal to about 5.1 eV, less than or equal to about 5.0 eV, or less than or equal to about 4.9 eV.

In an embodiment, a work function of the second electrode (e.g., an cathode) may be greater than or equal to about 3.4 eV, greater than or equal to about 3.5 eV, greater than or equal to about 3.6 eV, greater than or equal to about 3.7 eV, greater than or equal to about 3.8 eV, greater than or equal to about 3.9 eV, greater than or equal to about 4.0 eV, greater than or equal to about 4.1 eV, greater than or equal to about 4.2 eV, greater than or equal to about 4.3 eV, greater than or equal to about 4.4 eV, or greater than or equal to about 4.5 eV. A work function of the second electrode (e.g., an cathode) may be less than or equal to about 5.0 eV, less than or equal to about 4.9 eV, less than or equal to about 4.8 eV, less than or equal to about 4.7 eV, less than or equal to about 4.6 eV, less than or equal to about 4.5 eV, or less than or equal to about 4.4 eV.

At least one of the first electrode 11 or the second electrode 15 may be a light-transmitting electrode and the light-transmitting electrode may be for example made of a conductive oxide such as a zinc oxide, an indium oxide, a tin oxide, an indium tin oxide (ITO), an indium zinc oxide (IZO), a fluorine doped tin oxide, a metal thin layer including a single layer or a multilayer, or a combination thereof. If one of the first electrode 11 or the second electrode 15 is a non-light-transmitting (e.g., non-transparent) electrode, it may include, for example, an opaque conductive material such as aluminum (Al), silver (Ag), gold (Au), or a combination thereof.

A thickness of the electrodes (the first electrode and/or the second electrode) is not particularly limited and may be appropriately selected with consideration of the device efficiency. For example, the thickness of the electrodes may be greater than or equal to about 5 nanometers (nm), for example, greater than or equal to about 50 nm, greater than or equal to about 100 nm, greater than or equal to about 500 nm, or greater than or equal to about 1 µm. For example, the thickness of the electrodes may be less than or equal to about 100 micrometers (µm), for example, less than or equal to about 10 µm, less than or equal to about 1 µm, less than or equal to about 900 nm, less than or equal to about 500 nm, or less than or equal to about 100 nm.

The emissive layer 13 includes a quantum dot (e.g., a plurality of quantum dots). The quantum dot (at times, also referred to herein as a semiconductor nanocrystal) may have a core-shell structure including a core including a first semiconductor nanocrystal and a shell disposed on the core and including a second semiconductor nanocrystal different from the first semiconductor nanocrystal.

The quantum dot (e.g., the first semiconductor nanocrystal and/or the second semiconductor nanocrystal) may include a Group II-VI compound, a Group III-V compound, a Group IV-VI compound, a Group IV element or compound, a Group compound, a Group compound, a Group I-II-IV-VI compound, or a combination thereof. The quantum dot (the first semiconductor nanocrystal, the second semiconductor nanocrystal, or a combination thereof) may not include a harmful heavy metal (e.g., cadmium, lead, mercury, or a combination thereof). For example, the plurality of the quantum dots do not include or are substantially free of harmful heavy metal (e.g., cadmium, lead, mercury, or a combination thereof). For instance, the plurality of the quantum dots do not include cadmium.

The Group II-VI compound may include a binary element compound including CdSe, CdTe, ZnS, ZnSe, ZnTe, ZnO, HgS, HgSe, HgTe, MgSe, MgS, or a combination thereof; a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary element compound including HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof. The Group II-VI compound may further include a Group III metal. A combination comprising at least two of the foregoing may also be used.

The Group II-IV compound may include a binary element compound including GaN, GaP, GaAs, GaSb, AlN, AlP, AlAs, AlSb, InN, InP, InAs, InSb, or a combination thereof; a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; or a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group III-V compound may further include a Group II metal (e.g., InZnP).

The Group IV-VI compound may include a binary element compound including SnS, SnSe, SnTe, PbS, PbSe, PbTe, or a combination thereof; a ternary element compound including SnSeS, SnSeTe, SnSTe, PbSeS, PbSeTe, PbSTe, SnPbS, SnPbSe, SnPbTe, or a combination thereof; or a quaternary element compound including SnPbSSe, SnPbSeTe, SnPbSTe, or a combination thereof.

Examples of the Group III-VI compound may include $CuInSe_2$, $CuInS_2$, CuInGaSe, or CuInGaS, but are not limited thereto. Examples of the Group I-II-IV-VI compound may include CuZnSnSe or CuZnSnS, but are not limited thereto. The Group IV element or compound may include a single substance selected from Si, Ge, or a combination thereof; or a binary element compound including SiC, SiGe, or a combination thereof. A combination comprising at least two of the foregoing may also be used.

In an embodiment, the first semiconductor nanocrystal may include a metal including indium, zinc, or a combination thereof; and a non-metal including phosphorous, selenium, tellurium, sulfur, or a combination thereof. In an embodiment, the second semiconductor nanocrystal may include a metal including indium, zinc, or a combination thereof; and a non-metal including phosphorous, selenium, tellurium, sulfur, or a combination thereof.

In an embodiment, the first semiconductor nanocrystal may include InP, InZnP, ZnSe, ZnSeS, ZnSeTe, or a combination thereof. In an embodiment, the second semiconductor nanocrystal may include ZnSe, ZnSeS, ZnS, ZnTeSe, or a combination thereof. In an embodiment, the quantum dots may emit blue light or green light and the quantum dots may include a core of ZnSeTe, ZnSe, or a combination thereof and a shell including Zn, Se, and S (e.g., ZnSeS). In the shell, the amount (or the concentration) of the sulfur may vary (e.g., increase or decrease) in a direction of radius (e.g. from the core toward a surface of the surface of the quantum dot). In an embodiment, the shell may include zinc, sulfur, and optionally selenium (e.g., at an outermost layer thereof). In an embodiment, the quantum dots may emit red light or green light, and the core may include InP, InZnP, or a combination thereof, and the shell may include a Group II metal including zinc and a non-metal including at least one of sulfur and selenium.

In an embodiment, the quantum dot may have a core-shell structure and an interface between the core and the shell may include or may not include an alloyed layer. The alloyed layer may be a homogeneous alloy or a gradient alloy. In the gradient alloy, a concentration of an element of the shell may vary with a radial direction (e.g., decrease or increase toward the core.

In an embodiment, the shell may have a composition varying in a radial direction. In an embodiment, the shell may be a multi-layered shell having at least two (shell) layers. In the multi-layered shell, two adjacent layers may have a composition different with each other. In the multi-layered shell, at least one layer may include independently an alloyed semiconductor nanocrystal. In the multi-layered shell, at least one layer may a composition varying in a radial direction.

In the core-shell structured quantum dot, the shell material and the core material may have different energy bandgaps from each other. In an embodiment, the energy bandgap of the shell material may be greater than that of the core material but is not limited thereto.

According to another embodiment, the energy bandgap of the shell material may be less than that of the core material. If the quantum dot does include a multi-layered shell, in the multi-layered shell, the energy bandgap of the outer layer may be greater than the energy bandgap of the inner layer (i.e., the layer nearer to the core). In the multi-layered shell, the energy bandgap of the outer layer may be less than the energy bandgap of the inner layer. In the multi-layered shell, an energy bandgap of the semiconductor nanocrystal of each layer may be selected appropriately in order for the quantum dot to efficiently exhibit a quantum confinement effect.

The semiconductor nanocrystal shell may include a first shell layer including zinc and selenium and a second shell layer disposed on the first shell layer and including zinc and sulfur. The first shell layer may be disposed directly on the core. The first shell layer may include ZnSe, ZnSeS, or a combination thereof. The first shell layer may not include sulfur.

The second shell layer may include ZnS. The second shell layer may not include selenium. The second shell layer may be disposed directly on the first layer. The second shell layer may be an outermost layer of the quantum dot.

The quantum dot may have a quantum efficiency of greater than or equal to about 10%, 20%, 30%, 40%, 50%, 60%, or 70%, greater than or equal to about 80%, or greater than or equal to about 90%. The quantum dot may exhibit a maximum photoluminescence peak with a full width at half maximum of less than or equal to about 50 nm, less than or equal to about 45 nm, less than or equal to about 35 nm, or less than or equal to about 30 nm.

In an embodiment, "quantum yield (or quantum efficiency)" is a ratio of photons emitted to photons absorbed, e.g., by a nanostructure or population of nanostructures. In an embodiment, the quantum efficiency may be determined by any method. For example, there may be two methods for measuring the fluorescence quantum yield or efficiency: the absolute method and the relative method. The absolute method directly obtains the quantum yield by detecting all sample fluorescence through the use of an integrating sphere. The relative method compares the fluorescence intensity of a standard sample with the fluorescence intensity of an unknown sample to calculate the quantum yield of the unknown sample. The QY may be readily determined by using commercially available equipment.

The quantum dot may include an organic ligand (e.g., a ligand having a hydrophobic moiety or a hydrophilic moiety) and optionally a halogen moiety for example, on a surface thereof. The organic ligand and optionally the halogen moiety may be attached (e.g., bound) to a surface of the quantum dot.

The organic ligand may include RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof, wherein R is independently a C3 to C40 substituted or unsubstituted aliphatic hydrocarbon group, such as a C3 to C40 (e.g., C5 or greater and C24 or less) substituted or unsubstituted alkyl, a C3 to C40 substituted or unsubstituted alkenyl, a C6 to C40 (e.g., C6 or greater and C20 or less) substituted or unsubstituted aromatic hydrocarbon group, such as a substituted or unsubstituted C6 to C40 aryl group, or a combination thereof.

Examples of the organic ligand may include a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine compound such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octylphosphine, dioctyl phosphine, tributylphosphine, or trioctylphosphine; an oxide of a phosphine compound such methyl phosphine oxide, ethyl phosphine oxide, propyl phosphine oxide, butyl phosphine oxide, pentyl phosphine oxide, tributylphosphine oxide, octyl phosphine oxide, dioctyl phosphine oxide, or trioctyl phosphine oxide; a diphenyl phosphine compound, a triphenyl phosphine compound, or an oxide compound thereof; C5 to C20 alkyl phosphinic acid such as hexylphosphinic acid, octylphosphinic acid, dodecanephosphinic acid, tetradecanephosphinic acid, hexadecanephosphinic acid, octadecanephosphinic acid; a C5 to C20 alkyl phosphonic acid such as hexyl phosphonic acid, octyl phosphonic acid, dodecane phosphonic acid, tetradecane phosphonic acid, hexadecane phosphonic acid, octadecane phosphonic acid; but are not limited thereto. A combination comprising at least two of the foregoing may also be used. The quantum dot may include a hydrophobic organic ligand either alone or in a combination comprising two or more hydrophobic ligands. The hydrophobic organic ligand may not include a photopolymerizable moiety (e.g., acrylate group, methacrylate group, etc.).

The halogen moiety may include chlorine, bromine, iodine, or a combination thereof. In an embodiment, the halogen moiety may include chlorine.

In an embodiment, the quantum dot may include a first organic ligand and halogen on a surface thereof. The first organic ligand may include a C6 to C40 aliphatic carboxylic acid compound (e.g., myristic acid, oleic acid, stearic acid, or the like). The carboxylic acid compound may include a compound represented by RCOOH (wherein R is a C12 or greater alkyl group or a C12 or greater alkenyl group).

In an embodiment, the quantum dot(s) may include halogen, and an amount of the halogen may be greater than or equal to about 1 microgram per milligram of quantum dots (ug/mg QD), for example, greater than or equal to about 2 ug/mg QD, greater than or equal to about 3 ug/mg QD, greater than or equal to about 4 ug/mg QD, greater than or equal to about 5 ug/mg QD, greater than or equal to about 6 ug/mg QD, or greater than or equal to about 7 ug/mg QD and less than about 30 ug/mg QD, less than or equal to about 25 ug/mg QD, less than or equal to about 20 ug/mg QD, less than or equal to about 12.4 ug/mg QD, less than or equal to about 12.3 ug/mg QD, less than or equal to about 12.2 ug/mg QD, less than or equal to about 12.1 ug/mg QD, less than or equal to about 12 ug/mg QD, less than or equal to about 11.9 ug/mg QD, or less than or equal to about 11.8 ug/mg QD. The mole ratio of the halogen (e.g., chlorine) relative to the organic ligand (e.g., fatty acid such as oleic acid) may be less than about 2.2, for example, less than or equal to about 2, less than or equal to about 1.9, less than or equal to about 1.8, less than or equal to about 1.7, or less than or equal to about 1.6. The mole ratio of the halogen relative to the organic ligand may be greater than or equal to about 0.5, for example, greater than or equal to about 0.6, greater than or equal to about 0.7, greater than or equal to about 0.8, or greater than or equal to about 0.9. The quantum dot including the halogen moiety may be prepared by contacting the quantum dots with a halogen (e.g. an organic or aqueous solution including the halogen) in an organic dispersion.

The absorption/photoluminescence wavelengths of the quantum dot may be modified by selecting a composition and a size of the quantum dot. A maximum photoluminescence peak wavelength of the quantum dot may be within an ultraviolet (UV) to infrared wavelength or may be a wavelength greater than the above wavelength range.

In an embodiment, the maximum photoluminescence peak wavelength of the quantum dot may be greater than or equal to about 300 nm, greater than or equal to about 430 nm, greater than or equal to about 440 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm.

In an embodiment, the maximum photoluminescence peak wavelength of the quantum dot may be less than or equal to about 800 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, less than or equal to about 540 nm, less than or equal to about 480 nm, less than or equal to about 475 nm, or less than or equal to about 470 nm.

In an embodiment, the maximum photoluminescence peak wavelength of the quantum dot may be from about 500 nm to about 650 nm.

In an embodiment, the quantum dot may emit green light and the maximum photoluminescence peak wavelength of the quantum dot may be from about 500 nm to about 550 nm. In an embodiment, the quantum dot may emit red light and the maximum photoluminescence peak wavelength of the quantum dot may be from about 600 nm to about 650 nm. In an embodiment, the quantum dot may emit blue light and the maximum photoluminescence peak wavelength of the quantum dot may be from about 440 nm to about 480 nm.

The quantum dot may have quantum efficiency of greater than or equal to about 10%, for example, greater than or equal to about 30%, greater than or equal to about 50%, greater than or equal to about 60%, greater than or equal to about 70%, greater than or equal to about 90%, or even about 100%.

The quantum dot may have a relatively narrow emission spectrum. The quantum dot may have, for example, a full width at half maximum (FWHM) of a photoluminescence wavelength spectrum of less than or equal to about 50 nm, for example, less than or equal to about 45 nm, less than or equal to about 40 nm, or less than or equal to about 30 nm.

The quantum dot(s) may have a particle size (or an average particle size) of greater than or equal to about 1 nm and less than or equal to about 100 nm. The particle size may refer to a diameter or an equivalent diameter which is calculated under the assumption it has a spherical shape based upon a 2D image obtained by (e.g., transmission) electron microscope analysis. The quantum dot(s) may have a particle size (or an average particle size) of about 1 nm to about 50 nm or about 1 nm to about 20 nm, and may be, for example, greater than or equal to about 2 nm, greater than or equal to about 3 nm, or greater than or equal to about 4 nm and less than or equal to about 50 nm, less than or equal to about 40 nm, less than or equal to about 30 nm, less than or equal to about 20 nm, less than or equal to about 15 nm, or less than or equal to about 10 nm. The shapes of the quantum dot(s) are not particularly limited. For example, the quantum dot may have a shape that includes a sphere, a polyhedron, a pyramid, a multipod, a cube, a rectangular parallelepiped, a nanotube, a nanorod, a nanowire, a nanosheet, or a combination thereof, but is not limited thereto.

The quantum dot may be commercially available or may be appropriately synthesized. When the quantum dot is synthesized as a colloidal dispersion, the particle size of the quantum dot may be relatively freely and uniformly controlled.

In one embodiment, the quantum dots may not include a thiol-containing organic compound, or a salt thereof bound to a surface of the quantum dots. In particular, the thiol-containing organic compound or the salt thereof that may not be included, or may not be present on a surface of the quantum dots, include butanethiol, pentanethiol, hexanethiol, heptanethiol, octanethiol, nonanethiol, decanethiol, undecanethiol, dodecanethiol, octadecanethiol, 2-(2-methoxyethoxy)ethanethiol, 3-methoxybutyl 3-mercaptopropionate, 3-methoxybutylmercaptoacetate, thioglycolic acid, 3-mercaptopropionic acid, thiopronin, 2-mercaptopropionic acid, a 2-mercaptopropionate ester, 2-mercaptoethanol, cysteamine, 1-thioglycerol, mercaptosuccinic acid, L-cysteine, dihydrolipoic acid, 2-(dimethylamino)ethanethiol, 5-mercaptomethyltetrazole, 2,3-dimercapto-1-propanol, glutathione, methoxypoly(ethylene glycol) thiol, dialkyldithiocarbamic acid or a metal salt thereof, or a combination thereof.

In an embodiment, the emission layer 13 may include a monolayer comprising a plurality of quantum dots. In another embodiment, the emission layer 13 may include at least one monolayer comprising a plurality of quantum dots, for example, 2 or more layers, 3 or more layers, or 4 or more layers, and 20 or less layers, or 10 or less layers, 9 or less layers, 8 or less layers, 7 or less layers, or 6 or less layers.

The emission layer 13 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The emissive layer 13 may have, for example, a thickness of about 10 nm to about 150 nm, for example about 10 nm to about 100 nm, for example about 10 nm to about 50 nm.

The emission layer may include a monolayer or a stacked (multi-layered) structure having at least two layers. In the multi-layered structure, adjacent layers (e.g., a first emission layer and a second emission layer) may have different properties and/or different composition. The emission layer may have a halogen amount varying with a thickness direction thereof. In the emission layer of an embodiment, the amount of the halogen may increase toward the electron auxiliary layer. In the emission layer of an embodiment, the amount of the halogen may decrease toward the electron auxiliary layer.

In an embodiment, the emission layer may have an amount of carbon that varies in a thickness direction thereof, For example, in an emission layer of an embodiment, the amount of the carbon may increase toward the electron auxiliary layer. In the emission layer of another embodiment, the amount of the carbon may decrease toward the electron auxiliary layer.

In an embodiment, the emission layer may include a first layer and a second layer disposed on the first layer, and in the first layer, the quantum dot may have a halogen exchanged (e.g., chlorine-exchanged) surface and in the second layer, the quantum dot may have a halogen exchanged (e.g., chlorine-exchanged) surface. An amount (a concentration) of an organic material (e.g., carbon) of the first layer may be less than that of the second layer. An amount (a concentration) of a halogen (e.g., chlorine) of the first layer may be greater than that of the second layer. An amount (a concentration) of an organic material (e.g., carbon) of the first layer may be greater than that of the second layer. An amount (a concentration) of a halogen (e.g., chlorine) of the first layer may be less than that of the second layer.

A HOMO energy level of the emissive layer 13 may be greater than or equal to about 5.4 eV, greater than or equal to about 5.6 eV, greater than or equal to about 5.7 eV, greater than or equal to about 5.8 eV, greater than or equal to about 5.9 eV, or greater than or equal to about 6.0 eV. The emissive layer 13 may have a HOMO energy level of less than or equal to about 7.0 eV, less than or equal to about 6.8 eV, less than or equal to about 6.7 eV, less than or equal to about 6.5 eV, less than or equal to about 6.3 eV, or than or equal to about 6.2 eV.

The emissive layer 13 may have, for example, a LUMO energy level of less than or equal to about 3.8 eV, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The emissive layer 13 may have a LUMO energy level of greater than or equal to about 2.5 eV.

In an embodiment, the emission layer 13 may have an energy bandgap of greater than or equal to about 2.4 eV and less than or equal to about 2.9 eV or greater than or equal to about 2.7 eV and less than or equal to about 3 eV.

In an embodiment, the light emitting device according to an embodiment may further include a hole auxiliary layer 12. The hole auxiliary layer 12 may be disposed between the first electrode 11 and the emissive layer 13. The hole auxiliary layer 12 may be a single layer or a multi-layer structure including at least two layers, wherein adjacent layers have different components. As shown in FIG. 1, the hole auxiliary layer 12 may include a hole injection layer (HIL), 12a, a hole transport layer (HTL) 12b, and/or an electron blocking layer (EBL) (not shown).

The HOMO energy level of the hole auxiliary layer 12 may be matched with the HOMO energy level of the emissive layer 13 in order to facilitate a mobility of a hole transmitted from the hole auxiliary layer 12 to the emissive layer 13. In an embodiment the hole auxiliary layer 12 may be a hole injection layer disposed near or proximate to the first electrode 11 and/or a hole transport layer near to the emission layer 13.

A material included in the hole auxiliary layer 12 is not particularly limited and may include, for example, poly (9,9-dioctyl-fluorene-co-N-(4-butylphenyl)-diphenylamine) (TFB), a poly(C6-C40)arylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4,4-bis[N-(1-naphthyl)-N-phenylamino]biphenyl (alpha-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenylcyclohexane] (TAPC), a p-type metal oxide (e.g., NiO, $WO_3$, $MoO_3$, etc.), a carbon-based material such as graphene oxide, or a combination thereof, but is not limited thereto.

A thickness of the hole injection layer, the hole transport layer, and/or the electron blocking layer may be greater than or equal to about 1 nm, greater than or equal to about 5 nm, greater than or equal to about 10 nm, greater than or equal to about 15 nm, greater than or equal to about 20 nm, or greater than or equal to about 25 nm and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

The hole injection layer and/or hole transport layer may be formed via a solution process (e.g., spin coating). The hole injection layer and/or hole transport layer may be formed via a vapor deposition process.

In a device of an embodiment, the electron auxiliary layer 14 is disposed between the emission layer 13 and the second electrode 12. The electron auxiliary layer 14 may include a first layer 14a disposed near to (or proximate or adjacent to) the emission layer and including a first metal oxide; and a second layer 14b disposed near to (or proximate or adjacent to) the second electrode and including a second metal oxide.

The first layer 14a may be disposed directly on (or in contact with) the emissive layer 13a. The second layer 14b may be disposed directly on (or in contact with) the first layer 14a. The second electrode 15 may be disposed directly on (or in contact with) the second layer 14b.

In an embodiment, a device may comprise a first layer 14a having a surface that contacts a surface of the second layer 14b to form an interface between the first and the second layer. An opposite surface of the second layer 14b would then be in contact with a surface of the second electrode 15 to form an interface between the opposite surface of the second layer 14b and the surface of the second electrode 15. An opposite surface of the first layer 14a would then be in contact with a surface of the emission layer.

In a device of an embodiment, an interface roughness between the second layer and the second electrode may be less than about 10 nm, less than or equal to about 9 nm, less than or equal to about 8 nm, less than or equal to about 7 nm, less than or equal to about 6 nm, less than or equal to about 5 nm, less than or equal to about 4 nm, or less than or equal to about 3 nm.

As used herein, a determination of interface roughness (or a surface roughness of the interface) may be obtained based on a vertical deviation of roughness profile (e.g., an amplitude parameter) as determined by a cross-sectional image of transmission or scanning electron microscopy (e.g., Cross-TEM or Cross-SEM imaging). The interface roughness may also be confirmed by an atomic force microscopy. The interface roughness may be reported as an arithmetical mean or root mean square (RMS) of the roughness profile.

The roughness profile may be obtained by using a commercial image analysis computer program (e.g., Image J) but is not limited thereto.

In the device, an absolute value of a difference between the work function of the second electrode and the conduction band edge energy level of the second layer 14b may be less than or equal to 0.5 eV, for example, less than or equal to about 0.4 eV, less than or equal to about 0.3 eV, less than or equal to about 0.2 eV, or less than or equal to about 0.1 eV. In a device of an embodiment, the conduction band edge energy level of the first layer 14a may be less than or equal to the conduction band edge energy level of the second layer 14b. The conduction band edge energy level of the first layer 14a and the conduction band edge energy level of the second layer 14b may be determined using a Kelvin probe force microscope analysis.

A quantum dot light emitting device that emits light by application of a voltage (hereinafter, QD-LED) includes quantum dots as a light emissive material. The QD-LED has a different light emitting principle different from that of an Organic Light Emitting Diode (OLED) in terms of a luminous center. The QD-LED may realize pure colors (Red, Green, Blue), achieving improved color reproducibility, and therefore, is attracting much attention as a next generation display element or device. Moreover, the emission layer of the QD-LED may be prepared by a method that involves a solution process, which has a commercial advantage of reduced production costs. Also, because the quantum dot is more of an inorganic based material, and is not associated with a metal-ligand environment as is a phosphorescent emitter of iridium or platinum, light emission may realize enhanced lifetime stability over OLED.

Figure 3:
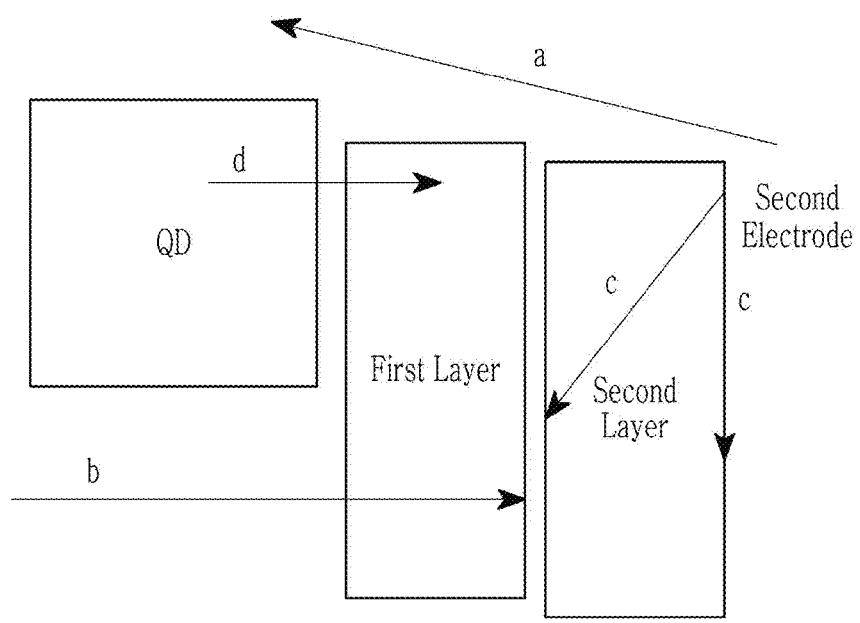
FIG. 3 is a schematic representation of an energy band diagram of an electrode, a first electron auxiliary layer, a second electron auxiliary layer, and an emission layer and a carrier flow a, b, c, and d, that may occur in a device of an embodiment.

In an embodiment, the device includes an electron auxiliary layer of the aforementioned structure having a plurality of layers of different physical and/or chemical properties, which may make it possible for the device to show enhanced electroluminescent properties and/or improved lifetime. In order to realize a device of light emitting element with the improved properties and lifetime demanded of a device, electrons and holes (i.e., carriers) injected from the cathode and the anode, respectively, may more readily or efficiently reach the emission layer and then recombine resulting in light emission. Referring to the schematic of FIG. 3, exemplifying the electron flow between the electron auxiliary layer (i.e., the first and the second layer) and the cathode (second electrode), it is believed that the electron auxiliary layer of a two layered structure may allow an efficient electron injection from the second electrode (pathway a) and may effectively block the flow of the holes from the emission layer (pathway b), may reduce the interface carrier recombination and the bulk non-emissive recombination (pathway c), and may reduce the ratio of the electrons that move away from the emission layer, i.e., in a direction against the electron injection direction (pathway d).

The present inventors have found that in a quantum dot based electroluminescent device, not only is the character of the energy barrier between the second electrode (cathode) and the auxiliary layer important for the efficient injection of the carriers, but also, the morphology of the interface may affect the efficient injection of the carriers. Moreover, the conduction band energy level of the auxiliary layer (e.g., the electron auxiliary layer) and the work function of the electrode (e.g., the metal electrode, and the interface between the auxiliary layer and the cathode may be correlated to improvement in luminous properties and lifetime of the light emitting device.

Unlike the organic based luminescent device, the QD-LED has many technological limitations (for example, in terms of the process temperature and the uses of the solvent) posed on its production process after the formation of the emission layer mainly due to the unique properties of the quantum dots. In the conventional process, a solution process (or a solvent treatment) may be carried out a plurality of times during the formation of the auxiliary layer in order to improve the carrier injection properties. The solution process may be advantageous as it may suppress or result in a reduction of damage to the quantum dots, and at the same time the solution process may reduce the production cost of the device. Nevertheless, the present inventors have found that the solution process may not be as advantageous as one may expect due to the formation of unspecified defects that may make it difficult to achieve the reproducible quality required in device production. In addition, the solution process may result in irregular shape of the device element layers. Moreover, besides the difficulties in selection of the auxiliary layer material, the underlying layer may be substantially affected by the subsequent process in the making of the auxiliary layer, and a shape of the formed layers may be significantly irregular, which may result in the deterioration of device properties and the lifetime.

In the device of the embodiment, the electron auxiliary layer may include a first layer formed on the quantum dot emissive layer (e.g., via a wet process) and a second layer having a controlled energy level with respect to the second electrode (or the cathode) and formed on the first layer. It then becomes possible to improve the electroluminescent properties and the lifetime of the device without adversely affecting the unique luminous properties of the quantum dots.

In the first layer, the first metal oxide may have a composition different from that of the second metal oxide of the second layer. The first metal oxide may include zinc, magnesium, calcium, zirconium, yttrium, titanium, tin, tungsten, nickel, copper, cobalt, molybdenum, vanadium, gallium, manganese, iron, aluminum, niobium, cerium, strontium, barium, indium, silicon, or a combination thereof. The first metal oxide may include $TiO_2$, $ZnO$, $SnO_2$, $WO_3$, $In_2O_3$, $Nb_2O_5$, $Fe_2O_3$, $CeO_2$, $SrTiO_3$, $Zn_2SnO_4$, $BaSnO_3$, $Al_2O_3$, $ZrO_2$, $SiO_2$, or a combination thereof. The first metal oxide may include a zinc oxide, a zinc magnesium oxide, a tin oxide, a titanium oxide, or a combination thereof.

The first metal oxide may be represented by Chemical Formula 1:

$$Zn_{1-x}M_xO \qquad \text{Chemical Formula 1}$$

In Chemical Formula 1, M is Mg, Ca, Zr, W, Li, Ti, Y, Al, or a combination thereof, and $0 \leq x < 0.5$.

The first layer may include a nanoparticle (or a plurality of nanoparticles) of the first metal oxide. An average particle size of the plurality of nanoparticles may be greater than or equal to about 1 nanometer (nm), for example, greater than or equal to 1.5 nm, greater than or equal to about 2 nm, greater than or equal to about 2.5 nm, or greater than or equal to about 3 nm. An average particle size of the plurality of nanoparticles may be less than or equal to about 10 nanometers, 9 nm, less than or equal to about 8 nm, less than or equal to about 7 nm, less than or equal to about 6 nm, or less than or equal to about 5 nm. It is preferred that the nanoparticles have a more spherical shape, rather than a rod shape or a nanowire shape.

In an embodiment, an amount of carbon in the first layer with respect to a molar amount of total elements in the first layer, may be greater than or equal to about 6 mol %, greater than or equal to about 7 mol %, greater than or equal to about 8 mol %, greater than or equal to about 9 mol %, greater than or equal to about 10 mol %, greater than or equal to about 11 mol %, greater than or equal to about 12 mol %, greater than or equal to about 13 mol %, greater than or equal to about 14 mol %, greater than or equal to about 15 mol %, greater than or equal to about 16 mol %, greater than or equal to about 17 mol %, greater than or equal to about 18 mol %, greater than or equal to about 19 mol %, greater than or equal to about 20 mol %, greater than or equal to about 21 mol %, greater than or equal to about 22 mol %, greater than or equal to about 23 mol %, greater than or equal to about 24 mol %, greater than or equal to about 25 mol %, greater than or equal to about 26 mol %, or greater than or equal to about 27 mol %.

In an embodiment, an amount of carbon in the first layer respect to a molar amount of total elements in the first layer, may be less than or equal to about 50 mol %, less than or equal to about 45 mol %, less than or equal to about 30 mol %, less than or equal to about 29 mol %, less than or equal to about 28 mol %, less than or equal to about 27 mol %, less than or equal to about 26 mol %, less than or equal to about 25 mol %, less than or equal to about 24 mol %, or less than or equal to about 23 mol %.

In an embodiment, an amount of carbon may be determined (or measured) (for example) by using an X-ray photoelectron spectroscopy (XPS) for any given layer. In an embodiment, an amount of carbon may be determined by an appropriate analysis tool such as an inductively coupled plasma atomic emission spectroscopy, a TEM-EDX, or the like. The amount of carbon may be determined by preparing a cross-section sample of the device and carrying out an analysis on the sample.

Without wishing to be bound by any theory, the amount of carbon in the aforementioned range may contribute to protection of the emission layer during the formation of the second layer described in detail below.

In an embodiment, the electron auxiliary layer of the device includes the second layer that has a controlled energy level and an enhanced interface morphology. The interface roughness between a surface of the first layer and a surface of the second layer may be less than or equal to about 12 nm. The surface roughness at the interface may be measured by an analysis of the cross-section of the light emitting device (e.g., cross-TEM or cross-SEM analysis). The interface roughness may be reported as an arithmetical mean or root mean square (RMS) of the roughness profile.

A surface roughness of the second layer and the first layer at the interface may be less than or equal to about 11 nm, less than or equal to about 10 nm, less than or equal to about 9 nm, less than or equal to about 8 nm, less than or equal to about 7 nm, less than or equal to about 6 nm, less than or equal to about 5 nm, or less than or equal to about 4 nm. A surface roughness of the second layer and the first layer at the interface may be less than or equal to about 3 nm, or less than or equal to about 2 nm. A surface roughness of the second layer and the first layer at the interface may be greater than or equal to about 0.01 nm, greater than or equal to about 0.1 nm, greater than or equal to about 0.2 nm, greater than or equal to about 0.5 nm, greater than or equal to about 0.7 nm, greater than or equal to about 0.9 nm, or greater than or equal to about 1 nm.

The second metal oxide of the second layer may include zinc, magnesium, calcium, zirconium, yttrium, titanium, tin, tungsten, nickel, copper, cobalt, molybdenum, vanadium, gallium, manganese, iron, aluminum, niobium, cerium, strontium, barium, indium, silicon, or a combination thereof.

The second metal oxide may include $TiO_2$, ZnO, $SnO_2$, $WO_3$, $In_2O_3$, $Nb_2O_5$, $Fe_2O_3$, $CeO_2$, $SrTiO_3$, $Zn_2SnO_4$, $BaSnO_3$, $Al_2O_3$, $ZrO_2$, $SiO_2$, or a combination thereof.

The second metal oxide may include a zinc oxide, a zinc magnesium oxide, a tin oxide, a titanium oxide, or a combination thereof.

The second metal oxide may be represented by Chemical Formula 2:

$$Zn_{1-x}M_xO \quad \text{Chemical Formula 2}$$

In Chemical Formula 2, M is Mg, Ca, Zr, W, Li, Ti, Y, Al, or a combination thereof, and $0 \le x < 0.5$.

In an embodiment, at least one of the first metal oxide and the second metal oxide (the first metal oxide and/or the second metal oxide) comprises zinc, magnesium, calcium, zirconium, yttrium, titanium, tin, tungsten, nickel, copper, cobalt, molybdenum, vanadium, gallium, manganese, iron, aluminum, niobium, cerium, strontium, barium, indium, silicon, or a combination thereof.

In an embodiment, at least one of the first metal oxide and the second metal oxide comprises a zinc oxide, a zinc magnesium oxide, a tin oxide, a titanium oxide, or a combination thereof.

In an embodiment, at least one of the first metal oxide and the second metal oxide is represented by Chemical Formula 1 as defined above.

In an embodiment, an interface roughness of (e.g., an opposite surface of) the second layer and (e.g., a surface of) the second electrode may be less than or equal to about 10 nm, less than or equal to about 9 nm, less than or equal to about 8 nm, less than or equal to about 7 nm, less than or equal to about 6 nm, less than or equal to about 5 nm, less than or equal to about 4 nm, less than or equal to about 3 nm, less than or equal to about 2 nm, or less than or equal to about 1 nm. In an embodiment, an interface roughness of the second layer and the second electrode may be less than or equal to about 3 nm.

In an embodiment, an interface roughness of the second layer and the second electrode may be greater than or equal to 0 nm, for example, 0.01 nm, greater than or equal to about 0.1 nm, greater than or equal to about 0.15 nm, greater than or equal to about 0.2 nm, greater than or equal to about 0.3 nm, greater than or equal to about 0.4 nm, or greater than or equal to about 0.5 nm.

An amount carbon in the second layer based on a total mole amount of elements included in the second layer may be less than or equal to about 12 mol %, less than or equal to about 11 mol %, less than or equal to about 10 mol %, less than or equal to about 9 mol %, less than or equal to about 8 mol %, less than or equal to about 7 mol %, less than or equal to about 6 mol %, less than or equal to about 5 mol %, less than or equal to about 4 mol %, less than or equal to about 3 mol %, less than or equal to about 2 mol %, or less than or equal to about 1 mol %.

An amount of carbon in the second layer based on a total mole amount of elements included in the second layer, may be greater than or equal to 0 mol %. An amount of carbon in the second layer based on a total mole amount of elements included in the second layer may be greater than or equal to about 0.05 mol %, greater than or equal to about 0.1 mol %, greater than or equal to about 0.15 mol %, greater than or equal to about 0.2 mol %, greater than or equal to about 0.25 mol %, greater than or equal to about 0.3 mol %, greater than or equal to about 0.35 mol %, greater than or equal to about 0.4 mol %, greater than or equal to about 0.45 mol %, greater than or equal to about 0.5 mol %, greater than or equal to about 0.55 mol %, greater than or equal to about 0.6 mol %, greater than or equal to about 0.65 mol %, greater than or equal to about 0.7 mol %, greater than or equal to about 0.75 mol %, greater than or equal to about 0.8 mol %, greater than or equal to about 0.85 mol %, greater than or equal to about 0.9 mol %, greater than or equal to about 0.95 mol %, or greater than or equal to about 1 mol %.

An absolute value of a difference between the conduction band edge energy level of the first layer and the conduction band edge energy level of the second layer may be greater than or equal to about 0.01 eV, greater than or equal to about 0.03 eV greater than or equal to about 0.05 eV (for example, 0.07 eV, greater than or equal to about 0.09 eV, greater than or equal to about 0.1 eV, greater than or equal to about 0.2 eV, greater than or equal to about 0.3 eV, or greater than or equal to about 0.4 eV). An absolute value of a difference between the conduction band edge energy level of the first layer and the conduction band edge energy level of the second layer may be less than or equal to about 1 eV, less than or equal to about 0.9 eV, less than or equal to about 0.8 eV, less than or equal to about 0.7 eV, less than or equal to about 0.6 eV, less than or equal to about 0.5 eV, less than or equal to about 0.4 eV, less than or equal to about 0.3 eV, less than or equal to about 0.2 eV, or less than or equal to about 0.1 eV.

The conduction band edge energy level of the first layer may be greater than or equal to the conduction band edge energy level of the second layer. The conduction band edge energy level of the first layer may be less than or equal to the conduction band edge energy level of the second layer.

The second layer 14b may be formed by a dry process. In an embodiment, the second layer 14b may be formed by physical vapor deposition (PVD) (e.g., sputtering, a thermal evaporation, or the like).

Prior to the formation of the QD emission layer during the production of the device, the formation of the layer via such a dry process may be readily carried out. However, after the formation of the QD emission layer, adopting a dry process for formation of a layer (e.g., auxiliary layer) may not be easy and may be practically impossible using a currently available technology as process conditions necessary for the aforementioned second layer having the aforementioned morphology and properties may have a seriously adverse effect on the quantum dot emission layer, resulting in that a final device may not even show the luminous properties. For example, the sputtering process forming the second layer having the aforementioned properties (e.g., the roughness) may necessarily involve using a high energy (e.g., plasma). Exposing the emission layer, and therefore the quantum dots, to such a high energy is likely to result in irreparable damage to the quantum dots.

However, in the device of the embodiment, the first layer may play a role as a buffer layer that protects the quantum dot emission layer. Moreover, the first layer can function as an electron transport/injection layer. Accordingly, in the embodiment, the process conditions that are necessary for the second layer to have desired properties and morphology can be adopted without significant damage to the emission layer or the quantum dots.

In a device of an embodiment, the second layer may exhibit a significantly low level of contact resistance with respect to the second electrode in comparison with the first layer. The contact resistance may be measured by using a Transmission Line Measurement (TLM) method, see experimental herein. The second layer 14b may have a contact resistance that is less than or equal to about $1 \times 10^8$ ohm, for example, less than or equal to about $1 \times 10^7$ ohm, less than or equal to about $5 \times 10^6$ ohm, less than or equal to about $3 \times 10^6$ ohm, less than or equal to about 2.6×10⁶ ohm, or less than or equal to about 2.5×10⁶ ohm.

In a device of an embodiment, the second layer may have a contact resistance that is at least about 10 times, at least about 100 times, at least about 200 times, at least about 300 times, at least about 400 times, or at least about 500 times lower than a contact resistance of the first layer. The second layer may exhibit an electrical conductivity that is at least about 10 times, at least about 100 times, at least about 200 times, at least about 300 times, at least about 400 times, or at least about 500 times greater than an electrical conductivity of the first layer.

A thickness of the electron auxiliary layer, the first layer, or the second layer may be selected appropriate taking into consideration of the luminous wavelength of the quantum dots, the thickness of the emission layer, or the like.

In an embodiment, a thickness of the first layer may be greater than or equal to about 2 nm, greater than or equal to about 3 nm, greater than or equal to about 4 nm, greater than or equal to about 5 nm, greater than or equal to about 7 nm, greater than or equal to about 9 nm, or greater than or equal to about 10 nm and/or less than or equal to about 50 nm, less than or equal to about 40 nm, less than or equal to about 30 nm, or less than or equal to about 25 nm. A thickness of the first layer may be greater than a thickness of the second layer. A thickness of the first layer may be less than a thickness of the second layer.

In an embodiment, a thickness of the second layer may be greater than or equal to about 2 nm, greater than or equal to about 3 nm, greater than or equal to about 4 nm, greater than or equal to about 5 nm, greater than or equal to about 7 nm, greater than or equal to about 9 nm, greater than or equal to about 10 nm, and/or less than or equal to about 70 nm, less than or equal to about 60 nm, less than or equal to about 50 nm, less than or equal to about 40 nm, less than or equal to about 30 nm, or less than or equal to about 25 nm.

In an embodiment, a thickness of the electron auxiliary layer may be greater than or equal to about 10 nm, greater than or equal to about 11 nm, greater than or equal to about 12 nm, greater than or equal to about 15 nm, greater than or equal to about 20 nm, or greater than or equal to about 25 nm and/or less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm.

Figure 2:
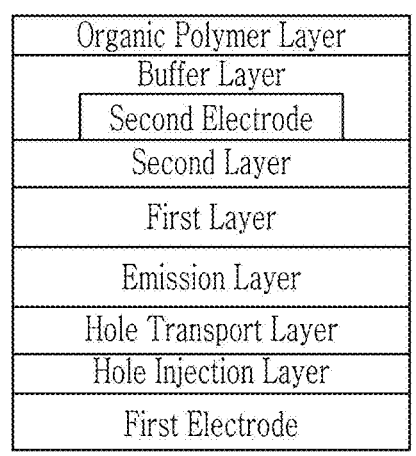
FIG. 2 is a schematic cross-sectional view of a non-limiting embodiment of a light emitting device

Referring to FIG. 2, the light emitting device of an embodiment may further include a buffer layer including a metal compound (e.g., a metal fluoride or an organic metal compound) (e.g., directly) on or over the second electrode 15 and optionally a portion of the second layer 14b of the electron auxiliary layer. The metal compound (e.g. the metal fluoride or the organic metal compound) may include lithium, aluminum, or a combination thereof. The organic metal compound may include an aromatic cyclic moiety, a heteroaromatic cyclic moiety, or a combination thereof. The organic metal compound may include a Liq, Alq3, or a combination thereof. The buffer layer may also comprise a metal fluoride, e.g., lithium fluoride.

The present inventors have also found that in a device of an embodiment, when the second layer 14b possesses the aforementioned properties (e.g., the conductivity and the surface roughness) and the device further includes an organic polymeric layer (that will be described below) together with the second layer, a high temperature aging process that is carried out in order to further enhance the device properties may result in serious deterioration of some of the properties of the device. Without wishing to be bound by any theory, such deterioration indicates that the polymer layer may have a substantial effect on the properties of the second layer during the high temperature aging process. In an embodiment, the device may further include the aforementioned buffer layer on the second electrode (and optionally on the second layer), whereby the deterioration may be prevented, reduced, or suppressed.

The buffer layer may have a property of a non-conductor. The buffer layer may have an electrical conductivity of less than or equal to about 3×10⁻³ Siemens per meter (S/m), or less than or equal to about 2.9×10⁻³ S/m, less than or equal to about 10⁻⁴ S/m, less than or equal to about 10⁻⁵ S/m, or less than or equal to about 10⁻⁶ S/m. The buffer layer may have a thickness of greater than or equal to about 3 nm, greater than or equal to about 4 nm, greater than or equal to about 5 nm, greater than or equal to about 6 nm, greater than or equal to about 7 nm, greater than or equal to about 8 nm, or greater than or equal to about 9 nm. The buffer layer may have a thickness of less than or equal to about 50 nm, less than or equal to about 40 nm, less than or equal to about 30 nm, or less than or equal to about 20 nm.

Referring to FIG. 2, the light emitting device may include an organic polymer layer disposed on, or directly disposed on, the second electrode. Accordingly, the organic polymer layer may not contact with a (major) surface of the second layer as the second electrode is instead disposed on the (major) surface. In other embodiment, in the optional absence of the buffer layer (as shown) the organic polymer layer may contact a minor (side) surface of the second layer in an embodied device. The organic polymer layer may include a polymerization product of a monomer combination (e.g., a monomer composition) including a compound having at least one carbon-carbon double bond (hereinafter an unsaturated compound). The monomer combination (e.g., a monomer composition) may further include a thiol compound. In an embodiment, the organic polymer layer may not include an unsaturated carboxylic acid compound or a polymer thereof, benzoic acid, 3-butenoic acid, crotonic acid, butyric acid, isobutyric acid, acetic acid, or a combination thereof. The organic polymer layer may cover (e.g., encapsulate) the first electrode, the second electrode, the emission layer, and/or the electron auxiliary layer. The polymerization product may include an electrically insulating polymer. The monomer combination (e.g., a monomer composition) may further include a (mono- or poly-) thiol compound having at least one (e.g. at least two) thiol groups. The polymerization product may further include a radical polymerization product between the unsaturated compound and the thiol compound.

The monomer combination (e.g., composition) including a thiol compound may include a multiple thiol compound and the multiple thiol compound may be represented by Chemical Formula A:

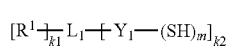

Chemical Formula A wherein, in Chemical Formula A, R¹ is hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group, a hydroxy group, —NH₂, a substituted or unsubstituted C1 to C30 amine group (—NRR', wherein R and R' are independently hydrogen or a C1 to C30 linear or branched alkyl group, and are not simultaneously hydrogen), an isocyanate group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' or —C(=O)ONRR' (wherein R and R' are independently hydrogen or a C1 to C20 linear or branched alkyl group), or a combination thereof, $L_1$ is a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, a substituted or unsubstituted C3 to C30 heteroarylene group (e.g., quinoline, quinolone, triazine, triazinetrione moiety, etc.), a C3 to C30 heterocycloalkylene group, or a substituted or unsubstituted C2 to C30 alkylene group or a substituted or unsubstituted C3 to C30 alkenylene group where at least one methylene (—CH₂—) is replaced by a sulfonyl group (—SO₂—), a carbonyl group ((—C(=O)), an ether group (—O—), a sulfide (—S—), a sulfoxide group (—SO—), an ester group (—O(=O)O—), an amide group (—O(=O)NR—, wherein R is hydrogen or a C1 to C10 alkyl group), or a combination thereof, $Y_1$ is a single bond, a substituted or unsubstituted C1 to C30 alkylene group, a substituted or unsubstituted C2 to C30 alkenylene group, or a substituted or unsubstituted C2 to C30 alkylene group or a substituted or unsubstituted C3 to C30 alkenylene group where at least one methylene (—CH₂—) is replaced by a sulfonyl group (—S(=O)₂—), a carbonyl group (—O(=O)—), an ether group (—O—), a sulfide group (—S—), a sulfoxide group (—S(=O)—), an ester group (—O(=O)O—), an amide group (—O(=O)NR—, wherein R is hydrogen or a C1 to C10 linear or branched alkyl group), an imine group (—NR—, wherein R is hydrogen or a C1 to C10 linear or branched alkyl group), or a combination thereof, m is an integer of 1 or greater, for example 1 to 10, k1 is 0 or an integer of 1 or greater, for example 1 to 10, k2 is an integer of 1 or greater, for example 1 to 10, and the sum of m and k2 is an integer of 3 or greater, for example 3 to 20, provided that when $Y_1$ is not a single bond, m does not exceed the valence of $Y_1$, and the sum of k1 and k2 does not exceed the valence of $L_1$.

The thiol compound (e.g., monothiol compound or the multiple thiol compound) may include a center moiety and at least one HS—R—* group bound to the center moiety (wherein, R is a direct bond, a substituted or unsubstituted C1 to C30 aliphatic hydrocarbon group, a sulfonyl group, a carbonyl group, an ether group, a sulfide group, a sulfoxide group, an ester group, an amide group, or a combination thereof, and * represents a point of attachment), and the center moiety is a carbon atom, a substituted or unsubstituted C1 to C30 aliphatic hydrocarbon group, a substituted or unsubstituted C3 to C30 alicyclic hydrocarbon group (e.g., tricycloalkane such as tricyclodecane), a substituted or unsubstituted C6 to C30 aromatic hydrocarbon group, a substituted or unsubstituted C3 to C30 heteroarylene group, a substituted or unsubstituted C3 to C30 heterocyclic group, or a combination thereof.

In the HS—R—* group bound to the center moiety, the R may be a substituted or unsubstituted C2 to C30 aliphatic hydrocarbon group where at least one methylene is replaced by a sulfonyl group, a carbonyl group, an ether group, a sulfide group, a sulfoxide group, an ester group, an amide group, or a combination thereof.

The multiple thiol compound may be represented by Chemical Formula A-1:

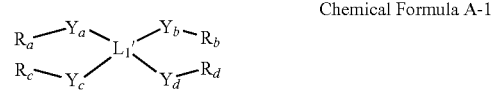

Chemical Formula A-1 wherein, in Chemical Formula A-1, $L_1'$ is the same as $L_1$ of Chemical Formula 1, and may be for example, carbon, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_a$ to $Y_d$ are independently a single bond, a substituted or unsubstituted C1 to C30 alkylene group, a substituted or unsubstituted C2 to C30 alkenylene group, or a substituted or unsubstituted C2 to C30 alkylene group or a substituted or unsubstituted C3 to C30 alkenylene group where at least one methylene (—CH₂—) is replaced by a sulfonyl group (—S(=O)₂—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), an imine group (—NR—) (wherein R is hydrogen or a C1 to C10 linear or branched alkyl group), or a combination thereof, and $R_a$ to $R_d$ are independently $R^1$ of Chemical Formula A or SH, provided that at least two of $R_a$ to $R_d$ are SH.

The center moiety, e.g., $L_1$ or $L_1'$ of Chemical Formula A or Chemical Formula A-1, may include a triazine moiety, a triazinetrione moiety, a quinoline moiety, a quinolone moiety, a naphthalene moiety, or a combination thereof.

The multiple thiol compound of Chemical Formula A may include nonanedithiol, glycol dimercaptopropionate (e.g., ethylene glycol dimercaptopropionate), trimethylolpropane tris(3-mercaptopropionate) having the structure of Chemical Formula A-2, pentaerythritol tetrakis(3-mercaptopropionate) having the structure of Chemical Formula A-3, pentaerythritol tetrakis(2-mercaptoacetate) having the structure of Chemical Formula A-4, tris[2-(ω-mercaptopropionyloxy)alkyl] isocyanurate having the structure of Chemical Formula A-5, a compound having the structure of Chemical Formula A-6, a compound having the structure of Chemical Formula A-7, a compound having the structure of Chemical Formula A-8, or a combination thereof:

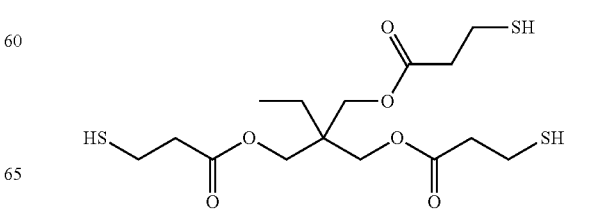

Chemical Formula A-2

Chemical Formula A-3

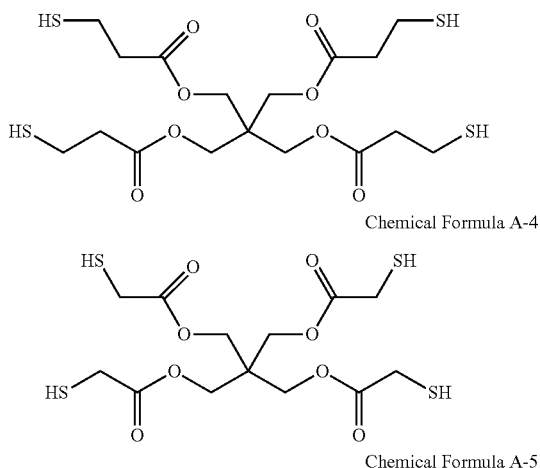

Chemical Formula A-4

Chemical Formula A-5 wherein, in Chemical Formula A-5, R is a substituted or unsubstituted C1 to C10 alkylene (e.g., methylene, ethylene, etc);

Chemical Formula A-6

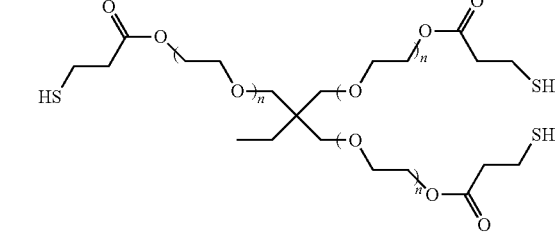

wherein, n is an integer of 1 to 20,

Chemical Formula A-7

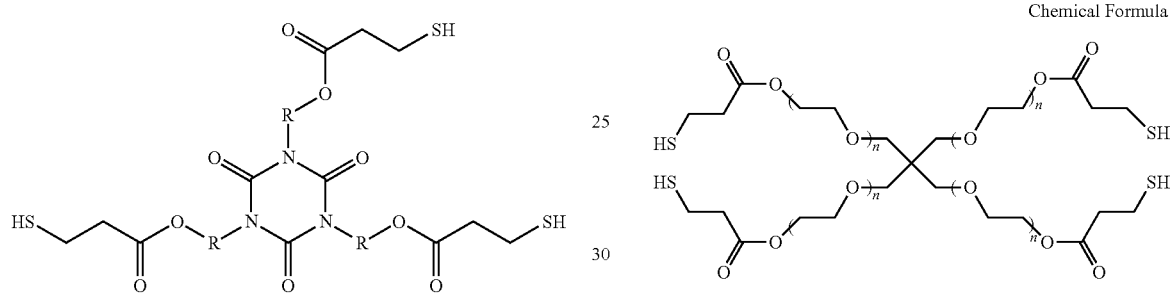

wherein, n is an integer of 1 to 20,

Chemical Formula A-8

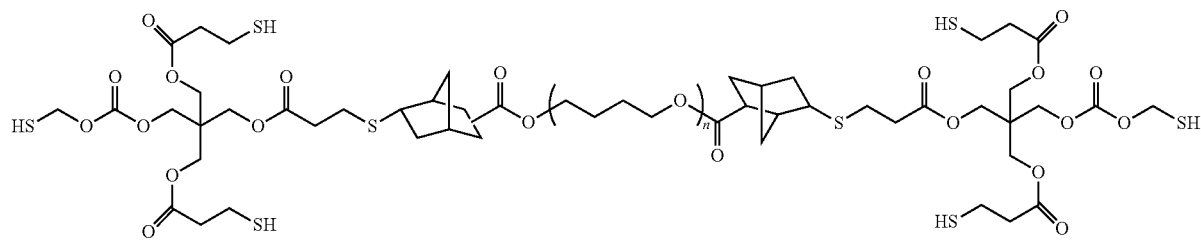

wherein, n is an integer of 1 to 20.

The multiple thiol compound may include a dimercaptoacetate compound, a tri mercaptoacetate compound, a tetramercaptoacetate compound, a dimercaptopropionate compound, a trimercaptopropionate compound, a tetramercaptopropionate compound, an isocyanate compound including at least two mercaptoalkylcarbonyloxyalkyl groups, an isocyanurate compound including at least two mercaptoalkylcarbonyloxyalkyl groups, or a combination thereof.

The unsaturated compound may be represented by Chemical Formula 2:

Chemical Formula 2

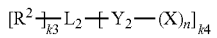

wherein, X is a C2-C30 aliphatic organic group having a carbon-carbon double bond or a carbon-carbon triple bond, a C6-C30 aromatic organic group having a carbon-carbon double bond or a carbon-carbon triple bond, or a C3-C30 alicyclic organic group having a carbon-carbon double bond or a carbon-carbon triple bond, $R^2$ is hydrogen, a substituted or unsubstituted C1 to C30 linear or branched alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group; a hydroxy group, —$NH_2$, a substituted or unsubstituted C1 to C30 amine group (—NRR', wherein R and R' are independently hydrogen or a C1 to C30 linear or branched alkyl group, and are not simultaneously hydrogen), an isocyanate group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted C1 to C20 alkylene group and X is a halogen), —O(=O)OR' (wherein R' is hydrogen or a C1 to C20 linear or branched alkyl group), —CN, or —O(=O)ONRR' (wherein R and R' are independently hydrogen or a C1 to C20 linear or branched alkyl group), $L_2$ is a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, or a substituted or unsubstituted C3 to C30 heteroarylene group (e.g., quinoline, quinolone, triazine, triazinetrione moiety, etc.), a C3 to C30 heterocycloalkylene group, or a substituted or unsubstituted C2 to C30 alkylene group or a substituted or unsubstituted C3 to C30 alkenylene group where at least one methylene (—$CH_2$—) is replaced by a sulfonyl group (—$SO_2$—), a carbonyl group ((—C(=O)—), an ether group (—O—), a sulfide group (—S—), a sulfoxide group (—SO—), an ester group (—O(=O)O—), an amide group (—C(=O)NR—) (wherein R is hydrogen or a C1 to 010 alkyl group), or a combination thereof, $Y_2$ is a single bond, a substituted or unsubstituted C1 to C30 alkylene group, a substituted or unsubstituted C2 to C30 alkenylene group, or a substituted or unsubstituted C2 to C30 alkylene group or a substituted or unsubstituted C3 to C30 alkenylene group where at least one methylene (—$CH_2$—) is replaced by a sulfonyl group (—S(=O)$_2$—), a carbonyl group (—O(=O)—), an ether group (—O—), a sulfide group (—S—), a sulfoxide group (—S(=O)—), an ester group (—O(=O)O—), an amide group (—O(=O)NR—) (wherein R is hydrogen or a C1 to C10 linear or branched alkyl group), an imine group (—NR—) (wherein R is hydrogen or a C1 to C10 linear or branched alkyl group), or a combination thereof, n is an integer of 1 or greater, for example, 1 to 10, k3 is 0 or an integer of 1 or greater, for example, 1 to 10, k4 is an integer of 1 or greater, for example, 1 to 10, the sum of n and k4 is an integer of 3 or more, for example 3 to 20, n does not exceed the valence of $Y_2$, and the sum of k3 and k4 does not exceed the valence of $L_2$.

In Chemical Formula 2, X may be an acrylate group, a methacrylate group, a C2 to C30 alkenyl group, a C2 to C30 alkynyl group, a substituted or unsubstituted C3 to C30 alicyclic organic group having a carbon-carbon double bond or a carbon-carbon triple bond in the ring, a substituted or unsubstituted C3 to C30 heterocycloalkyl group having a carbon-carbon double bond or a carbon-carbon triple bond in the ring, a C3 to C30 alicyclic organic group substituted with a C2 to C30 alkenyl group or a C2 to C30 alkynyl group, or a C3 to C30 heterocycloalkyl group substituted with a C2 to C30 alkenyl group or a C2 to C30 alkynyl group.

The unsaturated compound may include a center moiety and at least two X'—R—* groups bound to the center moiety, wherein, X is a moiety including a carbon-carbon unsaturated bond, for example, X as defined in Chemical Formula 2, R is direct bond, a substituted or unsubstituted C1 to C30 aliphatic hydrocarbon group, where at least one methylene is replaced by sulfonyl moiety, carbonyl moiety, ether moiety, sulfide moiety, sulfoxide moiety, ester moiety, amide moiety, or a combination thereof, and * indicates a point of attachment to the center moiety. The center moiety may include a carbon atom, a substituted or unsubstituted C1 to C30 aliphatic hydrocarbon group, a substituted or unsubstituted C3 to C30 alicyclic hydrocarbon group, a substituted or unsubstituted C6 to C30 aromatic hydrocarbon group, a substituted or unsubstituted C3 to C30 heteroarylene group, a substituted or unsubstituted C3 to C30 heterocyclic group, or a combination thereof.

In the X'—R—*, R may be a substituted or unsubstituted C2 to C30 aliphatic hydrocarbon group where at least one methylene is replaced by sulfonyl moiety, carbonyl moiety, ether moiety, sulfide moiety, sulfoxide moiety, ester moiety, amide moiety, or a combination thereof.

In the center moiety of Chemical Formula 2, $L_2$ may be a triazine moiety, a triazinetrione moiety, a quinoline moiety, a quinolone moiety, a naphthalene moiety, or a combination thereof.

The substituted or unsubstituted C3 to C30 alicyclic organic group having the carbon-carbon double bond or the carbon-carbon triple bond in the ring may include a norbornene group, a maleimide group, a nadimide group, a tetrahydrophthalimide group, or a combination thereof.

In Chemical Formula 2, $L_2$ may be a group including a pyrrolidine moiety, a tetrahydrofuran moiety, a pyridine moiety, a pyrimidine moiety, a piperidine moiety, a triazine moiety, a triazinetrione moiety, a tricycloalkane moiety (e.g. tricyclodecane), a tricycloalkene moiety, or an isocyanurate moiety.

The unsaturated compound may be a C4 to C100 diallyl compound, a C4 to C100 triallyl compound, a C4 to C100 diallyl ether compound, a C4 to C100 triallyl ether compound, a C4 to C100 di(meth)acrylate compound, a C4 to C100 tri(meth)acrylate compound, a divinyl ether compound, or a combination thereof.

The unsaturated compound may be a C4 to 040 diallyl compound, a C4 to C40 triallyl compound, a C4 to C40 diallyl ether compound, a C4 to C40 triallyl ether compound, a C4 to C40 di(meth)acrylate compound, a C4 to C40 tri(meth)acrylate compound, a divinyl ether compound, or a combination thereof.

The unsaturated compound of Chemical Formula 2 may be a compound represented by Chemical Formula 2-1, Chemical Formula 2-2, or Chemical Formula 2-3.

Chemical Formula 2-1

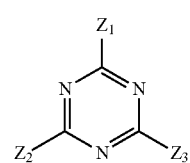

-continued

Chemical Formula 2-2

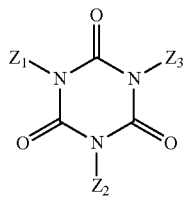

In Chemical Formulae 2-1 and 2-2, $Z_1$ to $Z_3$ are independently a *—$Y_2$—$X_n$ group, which is the same as defined for Chemical Formula 2;

Chemical Formula 2-3

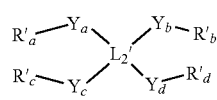

wherein, in Chemical Formula 2-3, $L_2'$ is carbon, a substituted or unsubstituted C1 to C30 alkylene group, a substituted or unsubstituted C2 to C30 alkenylene group, a substituted or unsubstituted C2 to C30 alkylene group wherein at least one methylene (—CH$_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), a C6 to C10 cycloalkylene group, or a combination thereof; a substituted or unsubstituted C3 to C30 alkenylene group wherein at least one methylene (—CH$_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), a C6 to C10 cycloalkylene group, or a combination thereof, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_a$ to $Y_d$ are independently a single bond, a substituted or unsubstituted C1 to C30 alkylene group, a substituted or unsubstituted C2 to C30 alkenylene group, or a substituted or unsubstituted C2 to C30 alkylene group or a substituted or unsubstituted C3 to C30 alkenylene group wherein at least one methylene (—CH$_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and $R'_a$ to $R'_d$ are independently $R^2$ or X as defined in Chemical Formula 2, provided that at least two of $R'_a$ to $R'_d$ are X as defined in Chemical Formula 2.

The unsaturated compound may include a compound of Chemical Formula 2-4, a compound of Chemical Formula 2-5, a compound of Chemical Formula 2-6, a compound of Chemical Formula 2-7, a compound of Chemical Formula 2-8, a compound of Chemical Formula 2-9, a compound of Chemical Formula 2-10, a compound of Chemical Formula 2-11, a compound of Chemical Formula 2-12, a compound of Chemical Formula 2-13, a compound of Chemical Formula 2-14, a compound of Chemical Formula 2-15, or a combination thereof:

Chemical Formula 2-4

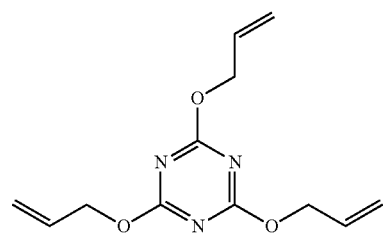

Chemical Formula 2-5

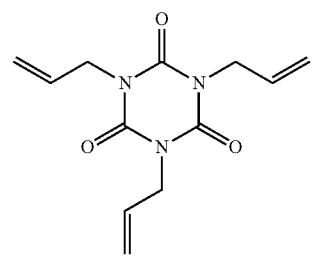

Chemical Formula 2-6

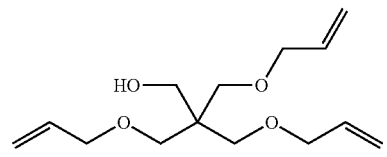

Chemical Formula 2-7

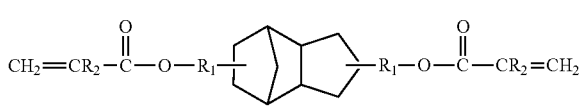

wherein, in Chemical Formula 2-7, $R_1$ is a C1 to C20 alkylene group, or a C2 to C20 alkylene group wherein at least one methylene (—CH$_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and $R_2$ is hydrogen or a methyl group;

Chemical Formula 2-8

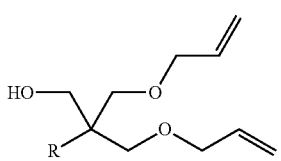

wherein, in Chemical Formula 2-8, R is a C1 to C10 alkyl group;

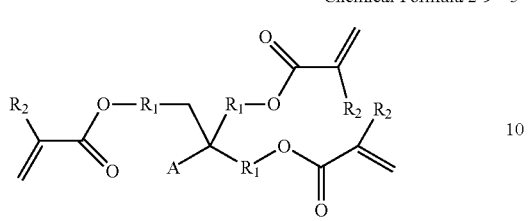

Chemical Formula 2-9 wherein, in Chemical Formula 2-9, A is hydrogen, a C1 to 010 alkyl group, or a hydroxy group, $R_1$ is a direct bond (single bond), a C1 to C20 alkylene group, or a C2 to C20 alkylene wherein at least one methylene (—$CH_2$—) is replaced by a sulfonyl group (—$S(=O)_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and $R_2$ is hydrogen or a methyl group;

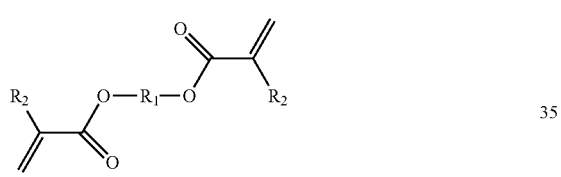

Chemical Formula 2-10 wherein, in Chemical Formula 2-10, $R_1$ is a single bond, a C1 to C20 alkylene, or a C1 to C20 alkylene wherein at least one methylene (—$CH_2$—) is replaced by a sulfonyl group (—$S(=O)_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and $R_2$ is hydrogen or a methyl group;

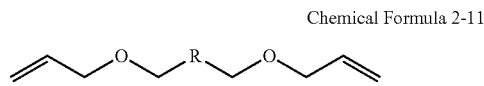

Chemical Formula 2-11 wherein, in Chemical Formula 2-11, R is a bond, a C1 to C20 alkylene, or a C2 to C20 alkylene wherein at least one methylene (—$CH_2$—) is replaced by a sulfonyl group (—$S(=O)_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and

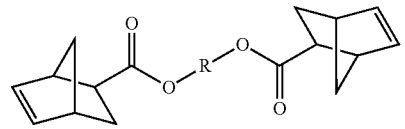

Chemical Formula 2-12 wherein, in Chemical Formula 2-12, R is a C1 to C20 alkylene, or a C2 to C20 alkylene wherein at least one methylene (—$CH_2$—) is replaced by a sulfonyl group (—$S(=O)_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, Chemical Formula 2-13

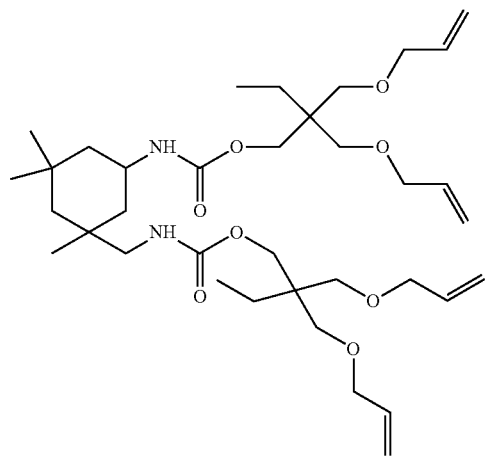

Chemical Formula 2-14

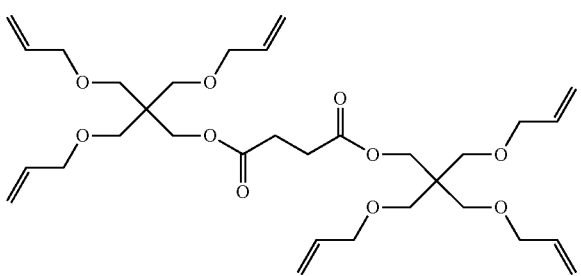

Chemical Formula 2-15

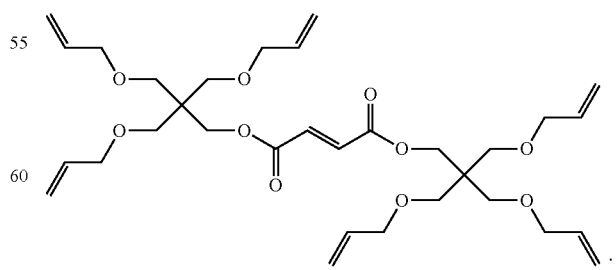

The light emitting device may emit blue light and a T50 of the light emitting device may be greater than or equal to about 10 hours. The light emitting device may have a maximum external quantum efficiency (EQE) of greater than or equal to about 12%.

In another embodiment, a method of manufacturing the aforementioned light emitting device includes, providing a first electrode, optionally forming a hole auxiliary layer on the first electrode, forming an emission layer on the first electrode (or optionally the hole auxiliary layer), forming an electron auxiliary layer on the emission layer as described herein; and forming a second electrode (e.g. a cathode) on the electron auxiliary layer), wherein the formation of the electron auxiliary layer includes forming a first layer including a first metal oxide disposed on, or disposed directly on, the emission layer; and forming a second layer including a second metal oxide disposed on, or disposed directly on, the first layer.

Details of the first electrode, the hole auxiliary layer, the second electrode, are as described above. The technical means of forming each of these device structure elements is well known to those of ordinary skill, and are selected appropriately considering the type of materials in the forming of each structural device element, and thickness of the electrodes and the hole auxiliary layer. The manners of forming may include a solution process, a deposition process, or a combination thereof. In an embodiment, the aforementioned hole auxiliary layer 12, the emissive layer including quantum dots 13, and the electron auxiliary layer 14 may be formed with a solution process, for example spin coating, slit coating, inkjet printing, nozzle printing, spraying, and/or a doctor blade coating, but is not limited thereto.

The forming of the emission layer may be performed by dispersing the quantum dots in a solvent (e.g., organic solvent) to obtain a quantum dot dispersion and applying or depositing the quantum dot dispersion on the substrate or the charge auxiliary layer in an appropriate manner (e.g., spin coating, inkjet printing, etc.). The forming of the emission layer may further include heat-treating the applied or deposited quantum dot layer. The heat-treating temperature is not particularly limited, and may be appropriately selected considering a boiling point of the organic solvent. For example, the heat-treating temperature may be greater than or equal to about 60° C. The organic solvent of the quantum dot dispersion is not particularly limited and thus may be appropriately selected. In an embodiment, the organic solvent may include a (substituted or unsubstituted) aliphatic hydrocarbon organic solvent, a (substituted or unsubstituted) aromatic hydrocarbon organic solvent, an acetate solvent, or a combination thereof.

In the formation of the electron auxiliary layer, the first layer may be formed by a wet process. The wet process may include a sol-gel process. In an embodiment, the wet process may include a dispersion obtained by dispersing nanoparticles of metal oxide in a polar solvent, applying the dispersion on the quantum dot emission layer for example by spin coating, and drying and annealing a resulting film. The polar solvent may include a C1 to C10 alcohol solvent such as methanol, or ethanol, a C2 to C20 sulfoxide solvent such as dimethyl sulfoxide, a C2 to C20 amide solvent such as dimethylformamide, or a combination thereof, but is not limited thereto.

The annealing may be carried out under vacuum at a predetermined temperature (e.g., greater than or equal to about 60° C., or greater than or equal to about 70° C. and less than or equal to about 100° C., for example, less than or equal to about 90° C., less than or equal to about 80° C., or less than or equal to about 75° C.), but is not limited thereto.

The second layer may be formed on the first layer. Formation of the second layer may be carried out by vapor deposition. Formation of the second layer may be carried out by a sputtering process. The target for the sputtering process may be selected considering a composition of the second metal oxide. Sputtering may be carried out under an inert atmosphere, for example, an atmosphere of argon or nitrogen gas. The sputtering process may include a RF sputtering. The sputtering may include a reactive sputtering. A gas pressure for the sputtering process may be greater than or equal to about 1 milliTorr (mTorr) and less than or equal to about 20 mTorr (e.g., from about 2 mTorr to about 15 mTorr, from about 3 mTorr to about 10 mTorr, or from about 4 mTorr to about 5 mTorr). The sputtering power may be greater than or equal to about 100 Watts (W) and less than or equal to about 1000 W, for example, from about 150 W to about 500 W, or from about 200 W to about 300 W.

The method of making the device may further include the formation of a buffer layer disposed on the second electrode, see FIG. 2. Details of the buffer layer may be the same as set forth above. The formation of the buffer layer may be carried out by a physical deposition (e.g., vapor deposition, thermal evaporation or the like) or a chemical deposition.

The method of making the device may further include forming an organic polymer layer disposed on the buffer layer, see FIG. 2. The formation of the polymer layer may include providing a monomer composition (at times, also referred to as polymer precursor mixture) including an unsaturated compound having at least two carbon-carbon unsaturated bonds; applying the monomer combination (or the monomer composition, hereinafter referred to as monomer composition) on the second electrode and optionally the buffer layer to form a polymer precursor layer; and conducting polymerization (e.g., cross-linking polymerization) of the monomer composition. The monomer composition may further include a thiol compound comprising at least one (e.g. at least two) thiol group(s). Details for the organic polymer layer are the same as set forth above.

The formation of the monomer composition is not particularly limited and may be selected appropriately. The monomer composition may include an oligomer fora desired polymer. The monomer composition may include the aforementioned unsaturated compound, a (poly- or mono-) thiol compound, or a combination thereof. The mixing may be carried out appropriately. If present, a ratio between the thiol compound and the unsaturated compound is not particularly limited and may be selected appropriately.

In an embodiment, a mole ratio of the unsaturated compound with respect to the (mono- or poly-) thiol compound (e.g., a mole ratio of the carbon-carbon double bond with respect to one mole of the thiol group) may be 0.1 or greater, 0.2 or greater, 0.3 or greater, 0.4 or greater, 0.5 or greater, 0.6 or greater, 0.7 or greater, 0.8 or greater, 0.9 or greater, 1 or greater, or 2 or greater, and/or 10 or less, for example, 9 or less, 8 or less, 7 or less, 6 or less, 5 or less, 4 or less, 3 or less, 2 or less, 1.9 or less, 1.8 or less, 1.7 or less, 1.6 or less, 1.5 or less, 1.4 or less, or 1.3 or less.

The monomer composition may further include additional component(s) such as an organic solvent, a mono-thiol, a mono-unsaturated compound having one carbon-carbon double bond, a curing inhibitor, a photoinitiator, a thermal initiator, or a combination thereof.

The polymerization of the monomer composition may be carried out under an atmosphere that may not include oxygen. The polymer precursor mixture may further include a photoinitiator and the polymerization may include a photopolymerization. The polymerization may be carried out at a temperature of greater than or equal to about 30° C., for example, greater than or equal to about 40° C., or greater than or equal to about 50° C. and less than or equal to about 100° C., for example, less than or equal to about 90° C., or less than or equal to about 80° C.

The polymerization time may be greater than or equal to about 1 minute, for example, greater than or equal to about 5 minutes, greater than or equal to about 10 minutes, or greater than or equal to about 20 minutes, and less than or equal to about 4 hours (hrs), for example, less than or equal to about 3 hrs, less than or equal to about 2 hrs, less than or equal to about 1 hrs, or less than or equal to about 1 hrs. The method may further include penetration/diffusion of the monomer composition. The penetration/diffusion may be carried out at a temperature of less than or equal to about 30° C. or at room temperature, and the penetration/diffusion may be conducted for example a time of greater than or equal to about 10 minutes, for example, greater than or equal to about 20 minutes, greater than or equal to about 30 minutes, greater than or equal to about 40 minutes, greater than or equal to about 50 minutes, or greater than or equal to about 1 hr and less than or equal to about 10 hrs, and less than or equal to about 9 hrs, less than or equal to about 8 hrs, less than or equal to about 7 hrs, less than or equal to about 6 hrs, less than or equal to about 5 hrs, or less than or equal to about 4 hrs.

The light emitting device of the embodiment may be applied in a display device or a lighting device. The light emitting device may be applied in various electronic devices.

Hereinafter, the embodiments are illustrated in more detail with reference to examples. However, these examples are exemplary, and the present disclosure is not limited thereto.

EXAMPLES

Analysis Methods
1. Photoluminescence Analysis

Photoluminescence (PL) spectra of the prepared nanocrystal (quantum dots) are obtained using a Hitachi F-7000 spectrometer at an irradiation wavelength of 372 nanometers (nm).
2. Ultraviolet (UV) Spectroscopy Hitachi U-3310 spectrometer is used to perform a UV spectroscopy and obtain UV-Visible absorption spectra.
3. TEM and TEM-EDX Analysis (1) Transmission electron microscope photographs of nanocrystals (quantum dots) are obtained using an UT F30 Tecnai electron microscope.

(2) For a cross-section of the device as prepared, TEM-EDX analysis are also conducted.
4. X-ray Diffraction (XRD) Analysis An XRD analysis is performed using a Philips XPert PRO equipment with a power of 3 kilowatts (kW).
5. Metal-Semiconductor-Metal (MSM) analysis A MSM analysis is carried out by using a MacScience JVL equipment.
6. Transmission Line Measurement (TLM) analysis A TLM analysis is carried out by using a MacScience JVL equipment. On a surface of a thin film of a semiconductor to be measured for conductivity, a plurality of metal electrodes are formed at different positional intervals. Then, any two electrodes are selected and a voltage is applied therebetween to measure a current. By doing this, a resistance value depending on a distance between the metal electrodes are obtained and from such data, a resistivity and a conductivity can be determined.
7. Electroluminescence Spectroscopy The obtained light emitting device is evaluated for an electro-luminescence property using a Keithley 2200 source measurement equipment and a Minolta CS2000 spectroradiometer (current-voltage-luminance measurement equipment). The current, luminance, and electroluminescence (EL) depending upon a voltage applied to the device is measured by the current-voltage-luminance measurement equipment, and thereby an external quantum efficiency (EQE) can be determined.
8. Lifetime Analysis (1) T50 (hr): a time taken for a given device to exhibit a 50% reduction of the initial luminance (100%) is measured with the device operated at 100 nit.

(2) T95 (hr): a time taken for a given device to exhibit 95% of the initial luminance (100%) is measured with the device operated at 100 nit.

Preparation of Quantum dots

Reference Example 1

(1) Selenium (Se) and tellurium (Te) are dispersed in trioctylphosphine (TOP) to obtain a 2 molar (M) Se/TOP stock solution and 0.1 M Te/TOP stock solution, respectively. 0.125 millimoles (mmol) of zinc acetate is added along with oleic acid and hexadecylamine to a reactor including trioctylamine and the resulting solution is heated under vacuum at 120° C. After one hour, an atmosphere of nitrogen is added to the reactor.

Subsequently, the reactor is heated up to 300° C., the prepared Se/TOP stock solution and Te/TOP stock solution are rapidly injected into the reactor in a Te:Se mole ratio of 1:25. After 60 minutes, acetone is added to the reaction solution, and the reaction mixture is rapidly cooled to room temperature. A precipitate obtained after centrifugation is dispersed in toluene to obtain a ZnTeSe core.

(2) 1.8 millimole (mmol) (0.336 g) of zinc acetate is added along with oleic acid to a reaction flask including trioctylamine and then vacuum-treated at 120° C. for 10 minutes. Nitrogen is then introduced into the reaction flask, and the temperature is increased up to 180° C. The ZnTeSe core obtained above is added to the reaction flask, Se/TOP stock solution is added and then a temperature is increased up to 280° C. Then, 1 M of STOP stock solution is added, the temperature is increased to 320° C., the Se/TOP stock solution and STOP stock solution are then added to the reaction flask in predetermined amounts. After the reaction is complete, the reactor is cooled, ethanol is added, and the mixture is centrifuged. The recovered nanocrystal is dispersed in toluene to obtain a toluene dispersion of ZnTeSe/ZnSeS core/shell quantum dots.

The used amounts of the S precursor and the Se precursor are about 0.25 moles and 0.6 moles pre one mole of the zinc precursor, respectively.

Reference Example 2

The quantum dots prepared in Reference Example 1 are dispersed in 5 mL of octane at a concentration of 20 milligrams per milliliter (mg/mL) to obtain quantum dot organic dispersion. Zinc chloride is dissolved in ethanol to obtain a zinc chloride solution having a concentration of 10 weight percent (wt %). 0.01 milliliters (mL) of the obtained zinc chloride solution is added to the prepared quantum dot organic dispersion and then, stirred at 60° C. for 30 minutes to perform a surface exchange reaction. After the reaction, ethanol is added thereto to induce a precipitation, and the quantum dots are recovered through centrifugation.

Synthesis of Metal Oxide Nanoparticles

Reference Example 3-1

Synthesis of $Zn_xMg_{1-x}O$ Nanoparticles

Zinc acetate dihydrate and magnesium acetate tetrahydrate are added into a reactor including dimethylsulfoxide to provide a mole ratio shown in the following chemical formula and heated at 60° C. in an air atmosphere. Subsequently, an ethanol solution of tetramethylammonium hydroxide pentahydrate is added into the reactor in a dropwise fashion at a speed of 3 milliliters per minute (mL/min). After stirring the mixture, the obtained $Zn_xMg_{1-x}O$ nanoparticles are centrifuged and dispersed in ethanol to provide an ethanol dispersion of $Zn_xMg_{1-x}O$ (x=0.85) nanoparticles.

The obtained nanoparticles are subjected to an X-ray diffraction analysis, to confirm a crystalline structure. The obtained nanoparticles are analyzed by a transmission electron microscopic analysis, and the results show that the particles have an average particle size of about 3 nm.

The obtained nanoparticles are measured for their UV-Vis absorption spectrum by using UV-Vis Spectrophotometer (UV-2600, SHIMADZU), and an energy bandgap of the nanoparticles is obtained from the band edge tangent line of the UV-Vis absorption spectrum. The results show that the synthesized $Zn_xMg_{1-x}O$ nanoparticles have an energy bandgap of about 3.52 eV to about 3.70 eV.

Reference Example 3-2

Synthesis of ZnO

ZnO nanoparticles are prepared in accordance with the same procedure as in Reference Example 3-1, except that the magnesium acetate tetrahydrate is not used in the preparation.

The resulting nanoparticles are analyzed by X-ray diffraction analysis to confirmed a crystalline structure of the ZnO crystals. The obtained ZnO nanoparticles are analyzed with transmission electron microscopy, and the results show that the particles have an average particle size of about 3 nm.

Example 1

[1] Manufacture of Light Emitting Device

Figure 4A:
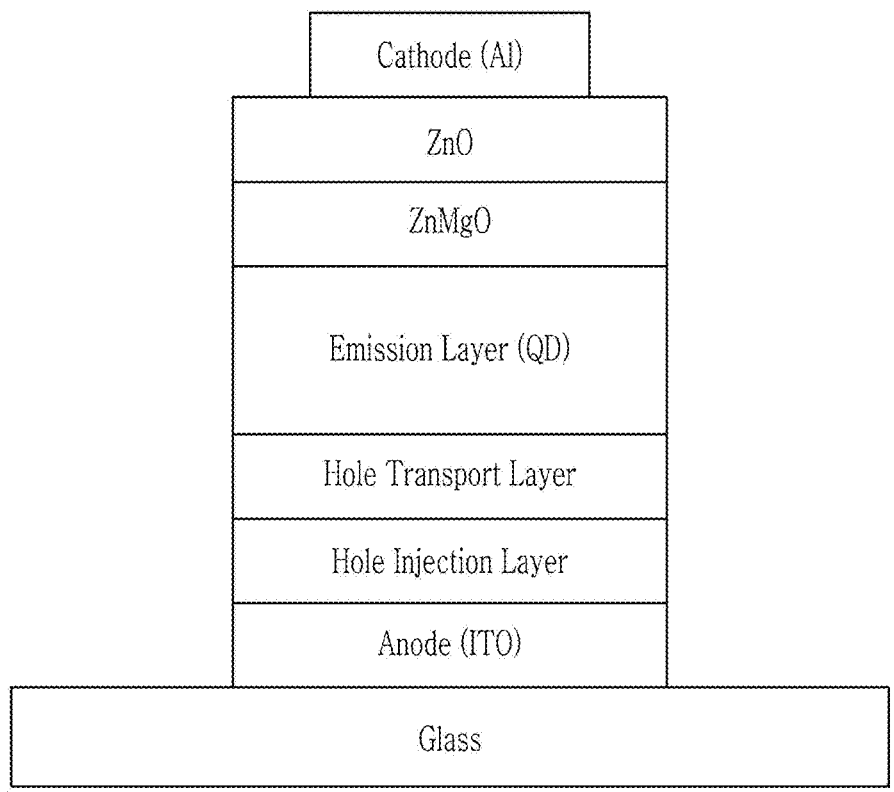
FIG. 4A is a schematic cross-sectional illustration of a device prepared in the Examples and Comparative Examples.

A device illustrated in FIG. 4A is prepared by the following process.

A glass substrate deposited with indium tin oxide (ITO) is surface treated with UV-ozone for 15 minutes, and then spin-coated with a PEDOT:PSS solution (H.C. Starks) and heated at 150° C. for 10 minutes under air atmosphere and heated again at 150° C. for 10 minutes under $N_2$ atmosphere to provide a hole injection layer (HIL) having a thickness of 30 nm. Subsequently, poly[(9,9-dioctylfluorenyl-2,7-diyl-co(4,4'-(N-4-butylphenyl)diphenylamine] solution (TFB) (Sumitomo) is spin-coated on the hole injection layer and heated at 150° C. for 30 minutes to provide a hole transport layer (HTL) having a thickness of 25 nm.

The quantum dot dispersion obtained from Reference Example 1 is spin-coated on the hole transport layer as obtained above, and a zinc chloride ethanol solution is dropped thereon and spin-dried, then the resulting structure is heat-treated at 80° C. for 30 minutes. Then, the quantum dot dispersion obtained from Reference Example 1 is spin-coated thereon to provide an emissive layer having a thickness of 25 nm.

A dispersion (dispersant: ethanol, optical density: 0.5 a.u) of $Zn_xMg_{1-x}O$ (x=0.85) nanoparticles obtained from Reference Example 3-1 is prepared. The prepared dispersion is spin-coated on the emissive layer and a heat treatment at 80° C. for 30 minutes is performed to provide a first layer for an electron auxiliary layer. The first layer has a thickness of about 20 nm.

On the first layer, a second layer is formed to obtain an electron auxiliary layer by a sputtering process in a Ar gas (100%) and plasma gas with respect to a zinc oxide target (purity: 99% or greater) at RF power of 300 W. The second layer has a thickness of about 10 nm.

Aluminum (Al) is vacuum-deposited on a portion of the surface of the obtained electron auxiliary layer (on the second layer) having a thickness of 90 nm to provide a second electrode.

A conduction band edge energy level of the ZnO layer may be measured to be about 4.3 eV. The work-function of the Al electrode may be measured to be about 4.2 eV. The conduction band edge energy level of the ZnMgO layer may be measured to be less than the conduction band edge energy level of the ZnO layer.

Figure 5A:
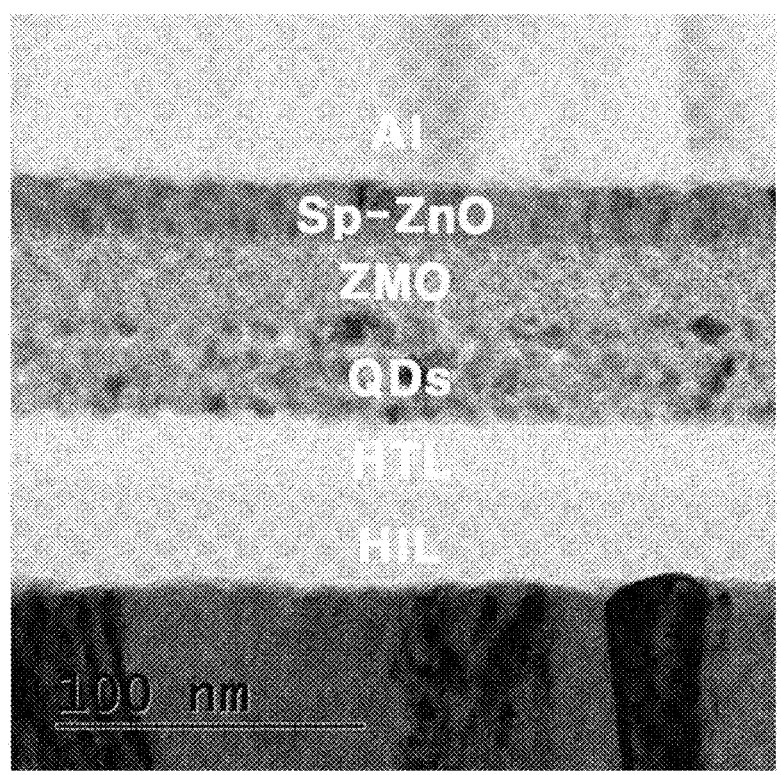
FIG. 5A is a Transmission Electron Microscopy (TEM) image of a cross-section of a device of Example 1.

[2] TEM analysis (1) A FIB (Focused ion beam) is used to prepare a device cross-section sample for the prepared device, which is then subjected to a TEM analysis. The results are shown in FIG. 5A. In the prepared device, an interface roughness between the second (Al) electrode and the second layer (sputtered ZnO, Sp-ZnO) is about 3.6 nm, and a surface roughness between the first layer and the second layer is about 8 nm.

Figure 5B:
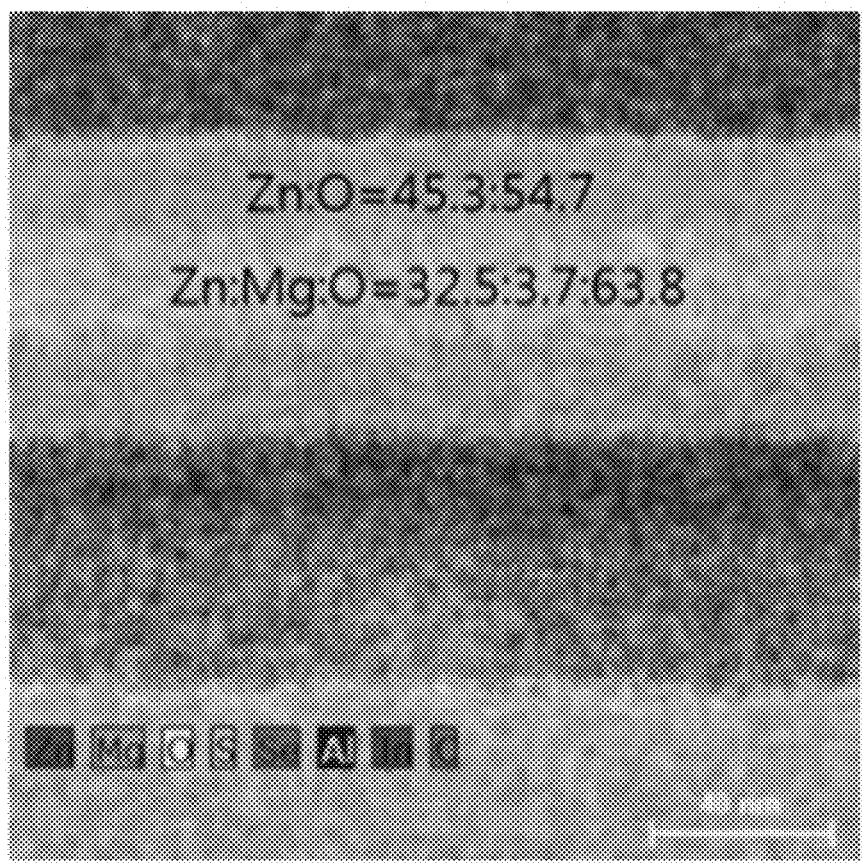
FIG. 5B is a view showing results of TEM-EDX analysis for the cross-section of the device of Example 1.

(2) An FIB (Focused ion beam) is used to prepare a device cross-section sample for the prepared device, which is then subjected to a Transmission Electron Microscopy-Energy Dispersive X-ray (TEM-EDX) analysis. The results are shown in FIG. 5B. As shown in FIG. 5B, it is confirmed that the ZnO layer formed by the sputtering process has a relatively high presence density of Zn.

Experimental Example 1

Figure 6:
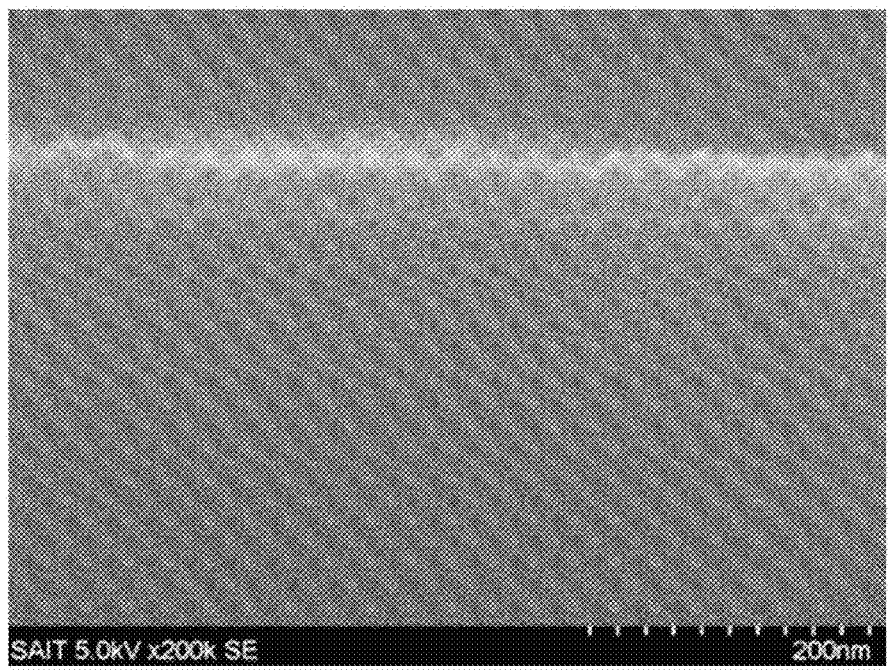
FIG. 6 is a TEM image of a cross-section of a layered structure of a first layer and a second layer formed on a Si substrate by the same method as Comparative Example 1.

[1] On a Si substrate, a layer of ZnMgO particles is formed using the particles of Reference Example 3-1 and on the layer of ZnMgO particles, a layer of ZnO particles is formed using the particles prepared in Reference Example 3-2 to obtain a stacked structure of Si/ZnMgO/ZnO. The results are shown in FIG. 6. From FIG. 6, it is confirmed that when the second layer is formed by a wet process, a surface roughness between the first layer and the second layer is greater than or equal to 20 nm.

[2] TLM and MSM analysis

A layer of ZnMgO particles is prepared using the particles of Reference Example 3-1, a layer of ZnO particles is prepared using the particles of Reference Example 3-2, a ZnO thin layer is prepared by the aforementioned sputtering. For the prepared three layers, a TLM analysis and an MSM analysis is made and the results are shown in Table 1 and Table 2.

TABLE 1

|  | ZMO formed by Wet process | ZnO formed by Wet process | ZnO formed by sputtering |
|---|---|---|---|
| Contact resistance (ohm) | $1.5 \times 10^{11}$ | $2 \times 10^{9}$ | $2.5 \times 10^{6}$ |
| resistivity (ohm · cm) | 1,350,000 | 75,000 | $3.5 \times 10^{3}$ |
| Conductivity (S/cm) | $7.41 \times 10^{-7}$ | $1.33 \times 10^{-5}$ | $2.83 \times 10^{-4}$ |

TABLE 2

|  | ZMO formed by Wet process | ZnO formed by Wet process | ZnO formed by sputtering |
|---|---|---|---|
| ITO/ETL/Ag: Current density at 6 V (mA/cm$^2$) | 437 | 2156 | 2500 |

Considering a current density at 6 V from the MSM analysis and the conductivity from the TLM analysis, the order of the conductivity of the film is sputtered ZnO>solution ZnO>ZnMgO. In addition, the order of the contact resistance with the Al electrode is sputtered ZnO<solution ZnO<ZnMgO.

Comparative Example 1-1

A device is prepared in the same manner as set forth in Example 1 except that the second layer is not formed (is not present) and a thickness of the first layer is 20 nm.

Comparative Example 1-2

A device is prepared in the same manner as set forth in Example 1 except that the first layer is not formed (is not present).

Experimental Example 2

Evaluation of Electroluminescent Properties of the Device

For the device of Example 1, Comparative Example 1-1, and Comparative Example 1-2, electroluminescent properties are measured and the results are summarized in Table 3.

TABLE 3

|  | EQE @ 10,000 nit | Max Lum. Cd | T95 hrs | T50 hrs |
|---|---|---|---|---|
| Comparative Example 1-1 | 2.8% | 2360 | 0.02 | 0.3 |
| Example 1 | 3.5% | 4660 | 0.15 | 1.3 |

EQE: external quantum efficiency
Max Lum.: maximum luminance
The device of Comparative Example 1-2 does not show luminous properties.

Example 2

A device is prepared in the same manner as set forth in Example 1 except that on the hole transport layer (HTL) as obtained, a quantum dot dispersion is spin-coated to form an emission layer having a thickness of about 28 nm and an organic polymer layer is formed on the cathode. For the prepared device, electroluminescent properties are measured and the results are shown in FIG. 7.

Comparative Example 2

A device is prepared in the same manner as set forth in Example 2 except that the second layer of ZnO is not formed. For the prepared device, electroluminescent properties are measured and the results are shown in FIG. 7.

Figure 7:
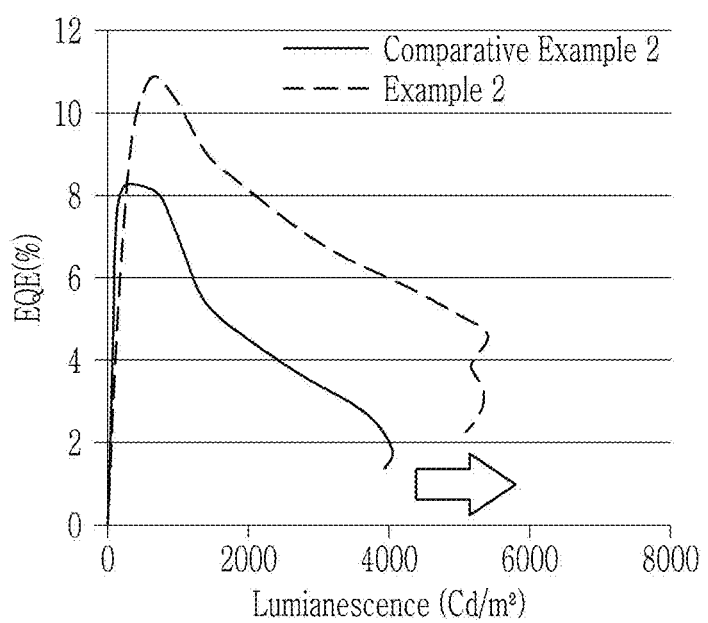
FIG. 7 is a graph plotting the electroluminescent properties (Luminance $Cd/m^2$ Vs EQE %) for the device of Example 2 and Comparative Example 2.

The results of FIG. 7 confirm that the properties of the device of Example 2 having the ZnO sputtered layer (the second layer) are significantly improved in comparison with Comparative Example 2, which does not include the ZnO sputtered layer (i.e., the second layer).

Example 3

A device is prepared in the same manner as set forth in Example 1 except that the emission layer is formed by using the halogen treated quantum dots prepared by Reference Example 2. For the prepared device, electroluminescent properties are measured and the results are shown in FIG. 8.

Comparative Example 3

A device is prepared in the same manner as set forth in Example 3 except that the second layer of ZnO is not formed. For the prepared device, electroluminescent properties are measured and the results are shown in FIG. 8.

Figure 8:
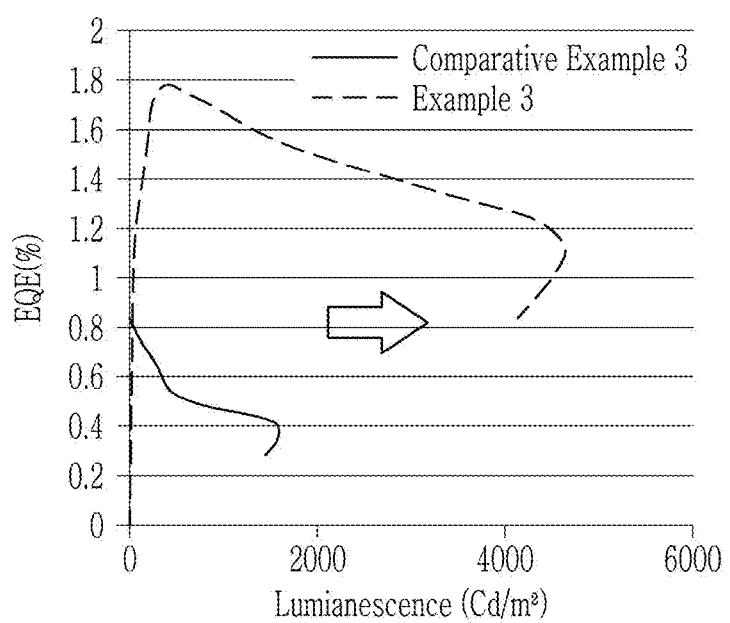
FIG. 8 is a graph plotting the electroluminescent properties (Luminance $Cd/m^2$ Vs EQE %) for the device of Example 3 and Comparative Example 3.

The results of FIG. 8 confirm that the properties of the device of Example 3 having the ZnO sputtered layer (the second layer) are significantly improved in comparison with Comparative Example 3, which does not include the ZnO sputtered layer.

Example 4

Figure 4B:
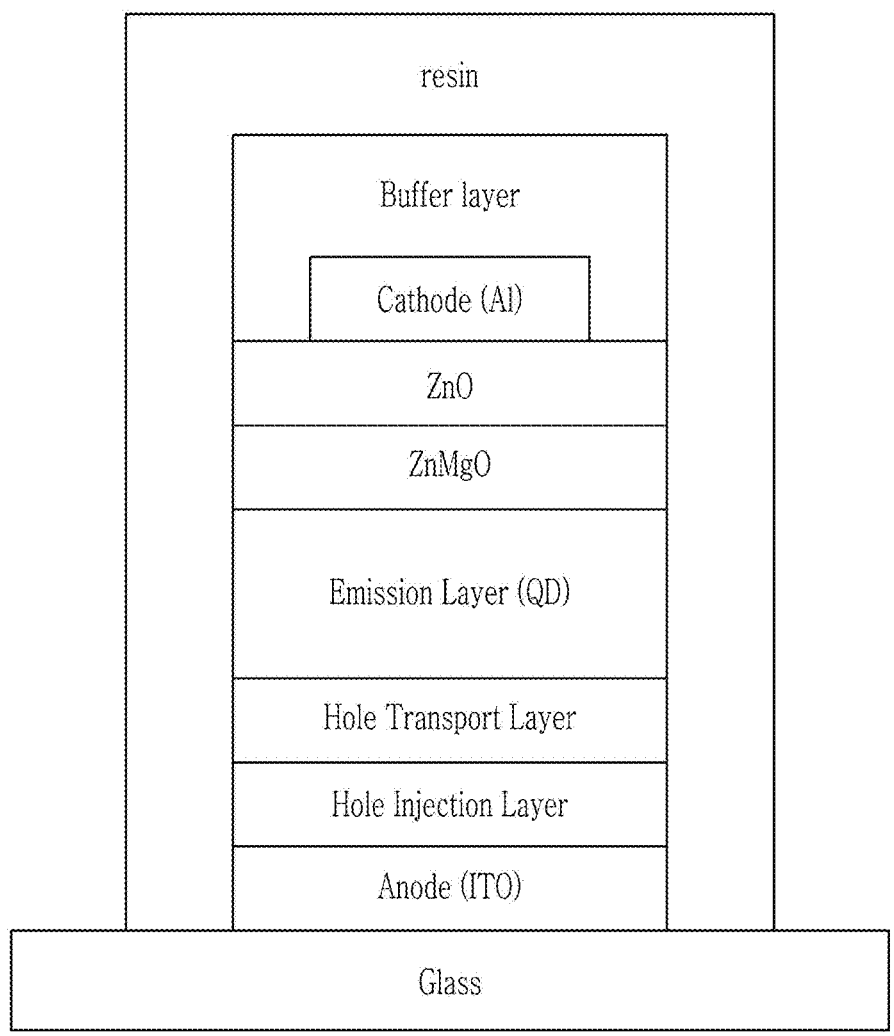
FIG. 4B is another schematic cross-sectional illustration of a device prepared in the Examples and Comparative Examples.

A device is prepared in the same manner as set forth in Example 2 except that after the formation of the cathode and prior to the formation of the organic polymer layer, a LiF buffer layer is formed by a thermal evaporation. A schematic cross-section view of the prepared device is shown in FIG. 4B.

Experimental Example 3

The device of Example 2 and the device of Example 4 are each subjected to an oven aging process for 10 days at a temperature of 70° C. and an ambient condition.

Figure 9A:
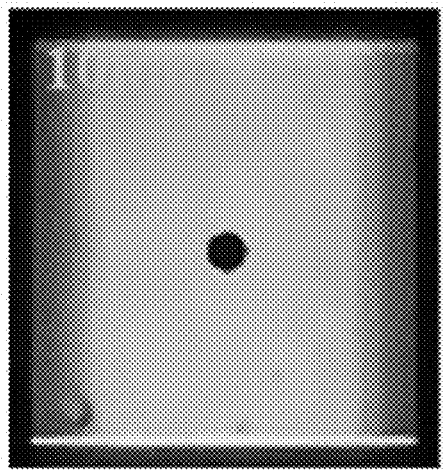
FIG. 9A is a picture of emission of the device without a buffer layer in Experimental Example 1 prior to and after an oven aging at a temperature of 70° C. for 10 days.
Figure 9A:
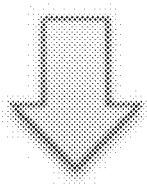
Figure 9A:
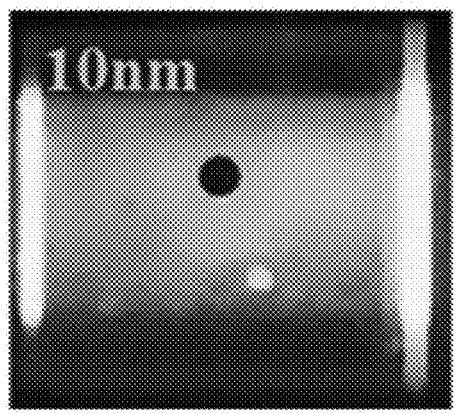
Figure 9B:
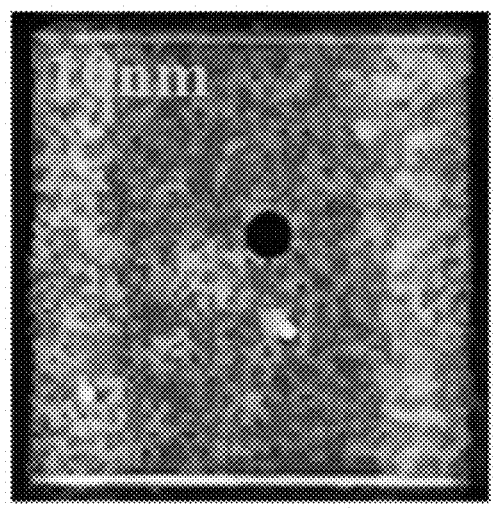
FIG. 9B is a picture of emission of the device with a buffer layer in Experimental Example 2 prior to and after an oven aging at a temperature of 70° C. for 10 days.
Figure 9B:
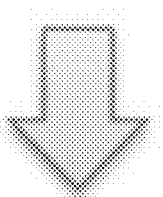
Figure 9B:
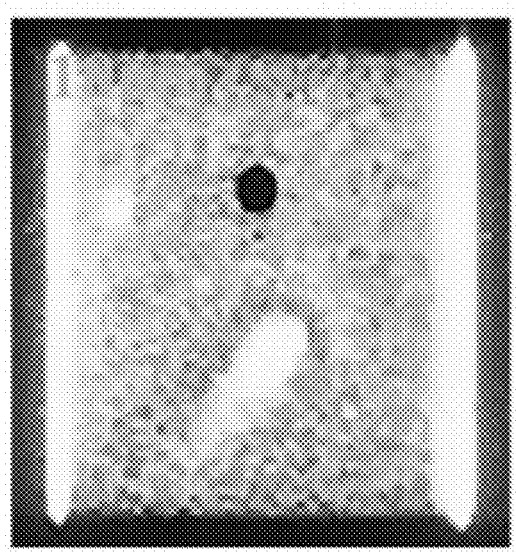

The pictures of the device of Example 2 and the device of Example 4 are shown in FIG. 9A and FIG. 9B, respectively. The results of FIG. 9A confirm that in the case of the device of Example 2, the oven aging process may result in damages to the light emitting face. The results of FIG. 9B indicate that the application of the buffer layer between the Al electrode and the polymer layer can minimize such damage, and the light emitting face of the device is relatively uniform even after the oven aging process.

Experimental Example 4

Figure 10:
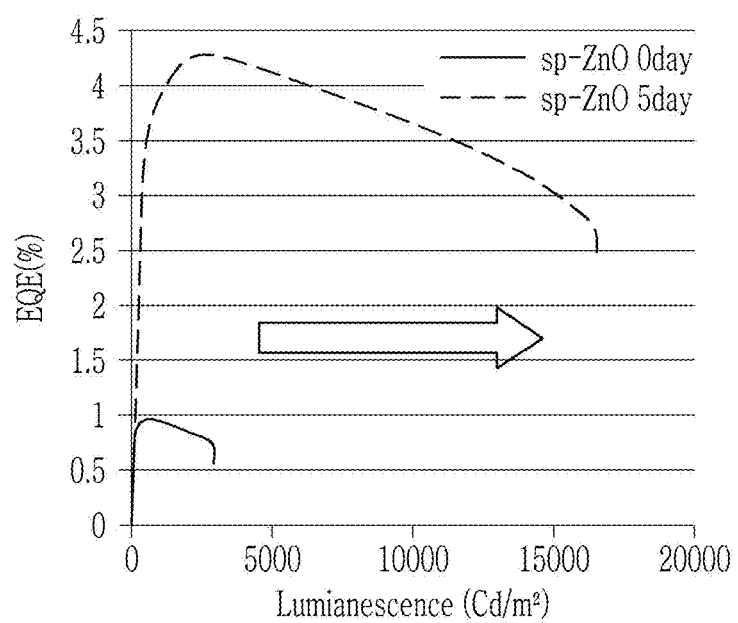
FIG. 10 is a view showing electroluminescent properties for the device with a buffer layer in Experimental Example 3 prior to and after an oven aging at a temperature of 70° C. for 5 days.

For the device of Example 4, the oven aging is carried out for five days at a temperature of 70° C. The electroluminescent properties are measured for both a non-aged and an aged device and some of the results are summarized in Table 4 and FIG. 10.

TABLE 4

|  | Max. EQE | EQE @ 100 nits | Max. Cd/A | Max Lum. Cd | T95 hrs | T50 hrs |
|---|---|---|---|---|---|---|
| After 5 day aging | 4.3 | 3.9 | 2.4 | 16350 | 1.75 | 16.3 |

* max. EQE: maximum external quantum efficiency
* EQE@ 100 nits: external quantum efficiency at 100 nit
* max Cd/A: Max current efficiency The results of Table 4 and FIG. 10 confirm that the device of Example 4 exhibits properties that are significantly improved by the oven aging process.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

11: first electrode
12: hole auxiliary layer
13: emission layer
14: electron auxiliary layer
15: second electrode

What is claimed is:

1. A light emitting device, comprising:
a first electrode and a second electrode with a surface facing the first electrode;
an emission layer disposed between the first electrode and the second electrode and comprising a quantum dot; and
an electron auxiliary layer disposed between the emission layer and the second electrode,
wherein the electron auxiliary layer comprises a first layer proximate to the emission layer and comprising a plurality of nanoparticles comprising a first metal oxide, and a second layer disposed on the first layer and proximate to the second electrode, the second layer comprising a second metal oxide,
wherein an interface roughness between the second layer and the surface of the second electrode is less than about 10 nanometers as determined by an electron microscopy analysis,
wherein the first metal oxide is represented by Chemical Formula 1:

$$Zn_{1-x}M_xO \qquad \text{Chemical Formula 1}$$

in the above formula, M is Mg, Ca, Zr, W, Li, Ti, Y, Al, or a combination thereof, and x is greater than 0 and less than or equal to 0.5, and
wherein the second layer does not include a metal oxide nanoparticle.

2. The light emitting device of claim 1, wherein the emission layer does not comprise cadmium.

3. The light emitting device of claim 1, wherein an amount of carbon in the first layer is greater than an amount of carbon in the second layer.

4. The light emitting device of claim 1, wherein an amount of carbon in the first layer is greater than about 6 mole percent based on a total mole amount of elements in the first layer.

5. The light emitting device of claim 1, wherein the first metal oxide has a composition different from the second metal oxide.

6. The light emitting device of claim 1, wherein the first metal oxide and the second metal oxide comprises zinc, and a presence density of zinc in the second layer is greater than a presence density of zinc in the first layer.

7. The light emitting device of claim 1, wherein the second metal oxide comprises a zinc oxide, a zinc magnesium oxide, a tin oxide, a titanium oxide, or a combination thereof.

8. The light emitting device of claim 1, wherein the second metal oxide is represented by Chemical Formula 1:

$$Zn_{1-x}M_xO \qquad \text{Chemical Formula 1}$$

in the above formula, M is Mg, Ca, Zr, W, Li, Ti, Y, Al, or a combination thereof, and x is greater than or equal to 0 and less than or equal to 0.5.

9. The light emitting device of claim 1, wherein the second layer comprises a vapor deposited film of the second metal oxide.

10. The light emitting device of claim 9, wherein an average particle size of the nanoparticles of the first metal oxide is greater than or equal to about 1 nanometer and less than or equal to about 10 nanometers.

11. The light emitting device of claim 1, wherein a surface of the second layer is disposed directly on a surface of the first layer.

12. The light emitting device of claim 11, wherein an interface roughness between the surface of the second layer and a surface of the first layer is less than or equal to about 12 nanometers as determined by an electron microscopy.

13. The light emitting device of claim 1, wherein an interface roughness between the second layer and the surface of the second electrode is less than or equal to about 5 nanometers.

14. The light emitting device of claim 1, wherein a thickness of the second layer is greater than or equal to about 1 nanometer and less than or equal to about 20 nanometers.

15. The light emitting device of claim 1, wherein an absolute value of a difference between a conduction band edge energy level of the second layer and a work function of the second electrode is less than or equal to about 0.5 electron volts or
wherein a conduction band edge energy level of the first layer is less than the conduction band edge energy level of the second layer and a difference between the conduction band edge energy level of the first layer and the conduction band edge energy level of the second layer is greater than or equal to about 0.05 electron volts.

16. The light emitting device of claim 1, wherein the light emitting device further comprises a buffer layer disposed on an opposite surface of the second electrode, and the buffer layer comprises an organic metal compound, a metal fluoride, or a combination thereof.

17. The light emitting device of claim 16, wherein a metal of the organic metal compound or the metal fluoride comprises lithium, aluminum, or a combination thereof; and an organic moiety of the organic metal compound comprises an aromatic cyclic moiety, a heteroaromatic cyclic moiety, or a combination thereof.

18. The light emitting device of claim 1, wherein the light emitting device further comprises an organic polymer layer disposed on an opposite surface of the second electrode.

19. The light emitting device of claim 18, wherein the organic polymer layer comprises a polymerization product of a monomer combination comprising a compound having at least one carbon-carbon double bond, and optionally a thiol compound.

20. The light emitting device of claim 1, wherein the light emitting device emits blue light, and a T50 of the light emitting device is greater than or equal to about 10 hours.

21. A display device comprising the light emitting device of claim 1.

* * * * *